(12) United States Patent
Dong

(10) Patent No.: US 7,898,864 B2
(45) Date of Patent: Mar. 1, 2011

(54) READ OPERATION FOR MEMORY WITH COMPENSATION FOR COUPLING BASED ON WRITE-ERASE CYCLES

(75) Inventor: Yingda Dong, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 91 days.

(21) Appl. No.: 12/490,550

(22) Filed: Jun. 24, 2009

(65) Prior Publication Data

US 2010/0329010 A1   Dec. 30, 2010

(51) Int. Cl.
  *G11C 16/04*   (2006.01)
(52) U.S. Cl. .............................. 365/185.19; 365/185.17; 365/185.21; 365/185.23; 365/185.03; 365/185.12
(58) Field of Classification Search ............ 365/185.17, 365/185.19, 185.21, 185.23, 185.03, 185.12
See application file for complete search history.

(56) References Cited

U.S. PATENT DOCUMENTS

| | | | |
|---|---|---|---|
| 6,999,344 B2 | 2/2006 | Hosono | |
| 7,187,585 B2 | 3/2007 | Li | |
| 7,372,730 B2 | 5/2008 | Chen | |
| 7,440,331 B2 | 10/2008 | Hemink | |
| 7,447,065 B2 | 11/2008 | Fong | |
| 7,480,176 B2 | 1/2009 | Kamei | |
| 7,505,315 B2 | 3/2009 | Honma | |
| 7,616,505 B2 * | 11/2009 | Mui et al. | 365/189.05 |
| 7,616,506 B2 * | 11/2009 | Mui et al. | 365/189.05 |
| 2006/0221683 A1 | 10/2006 | Chen | |
| 2008/0158973 A1 | 7/2008 | Mui | |
| 2008/0158985 A1 | 7/2008 | Mokhlesi | |
| 2008/0266978 A1 | 10/2008 | Goda | |
| 2008/0291730 A1 | 11/2008 | Aritome | |
| 2008/0316818 A1 | 12/2008 | Park | |
| 2009/0067257 A1 | 3/2009 | Lee | |
| 2009/0073763 A1 | 3/2009 | Hosono | |
| 2010/0034022 A1 * | 2/2010 | Dutta et al. | 365/185.18 |

* cited by examiner

*Primary Examiner*—Hoai V Ho
*Assistant Examiner*—Kretelia Graham
(74) *Attorney, Agent, or Firm*—Vierra Magen Marcus & DeNiro LLP

(57) ABSTRACT

A read operation for non-storage elements compensates for floating gate-to-floating gate coupling and effects of program-erase cycles. During programming of a word line WLn+1, the threshold voltages of previously-programmed storage elements on WLn are increased due to coupling. To compensate for the increase, during a subsequent read operation of WLn, different sets of pass voltages are applied to WLn+1 for each control gate read voltage which is applied to WLn. The pass voltages vary in each different set so that they are a function of the control gate read voltage which is applied to WLn. The pass voltages may also be a function of a number of program-erase cycles. A higher amount of compensation is provided by increasing the pass voltages as the number of program-erase cycles increases.

20 Claims, 15 Drawing Sheets

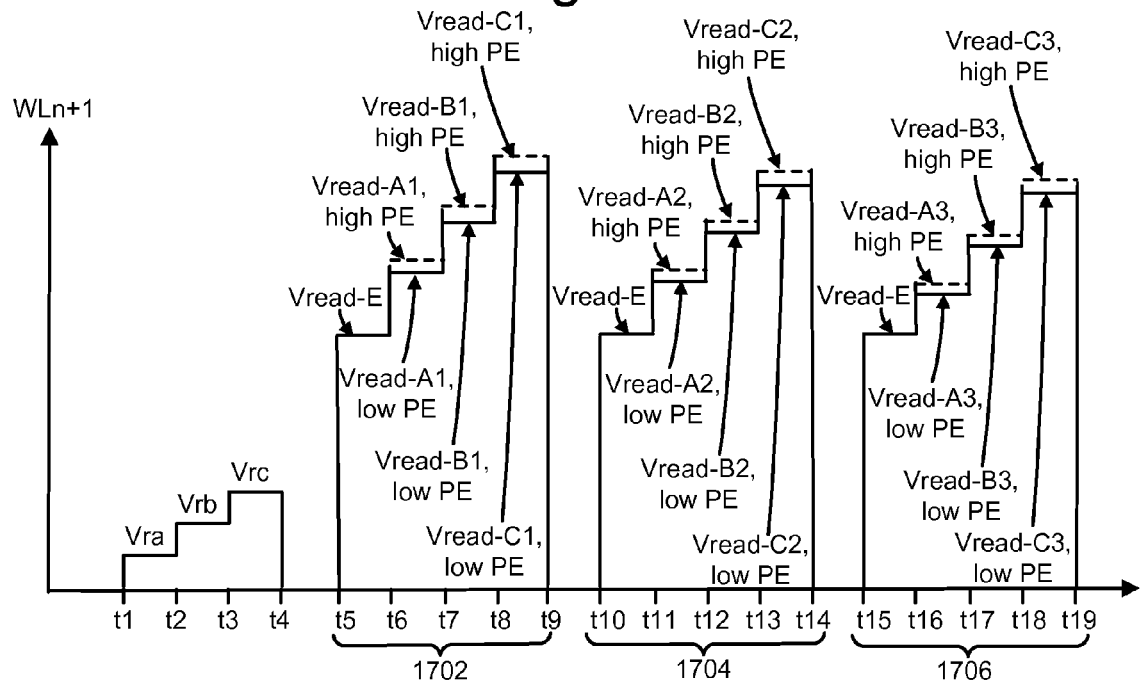
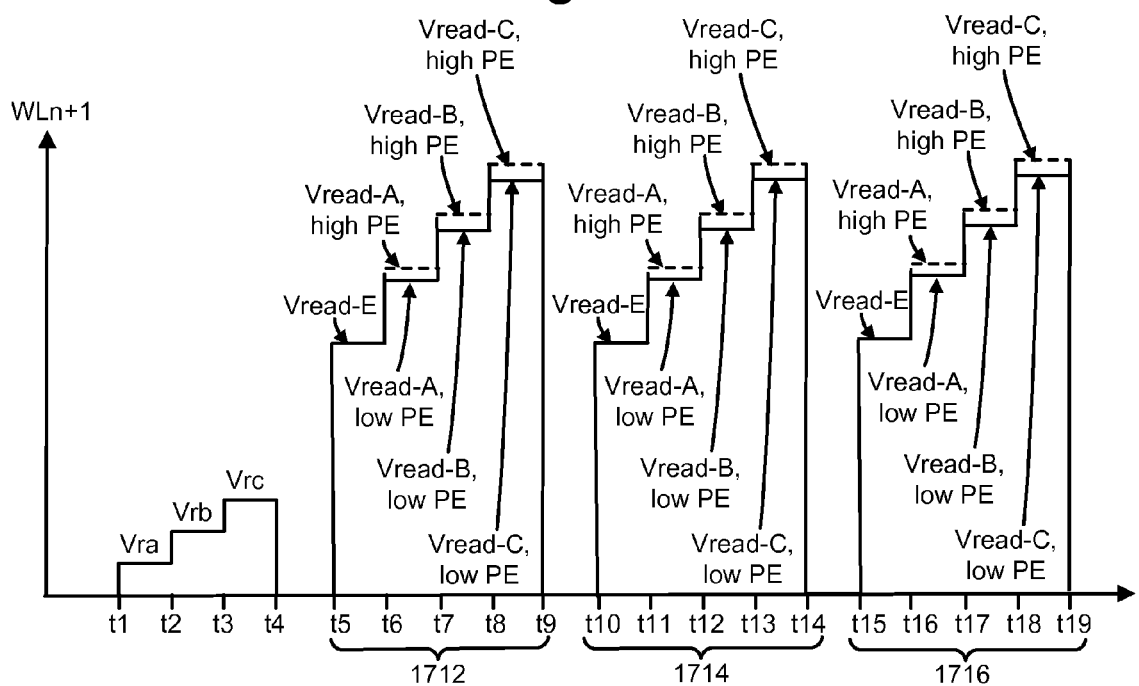

READ OPERATION FOR MEMORY WITH COMPENSATION FOR COUPLING BASED ON WRITE-ERASE CYCLES

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. $V_{PGM}$ can be applied to the control gates of flash memory elements. In the periods between the programming pulses, verify operations are carried out. That is, the programming level of each element of a group of storage elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

However, shifts in the apparent charge stored on a floating gate or other charge storage region can occur because of coupling of an electric field based on the charge stored in neighboring floating gates. The floating gate-to-floating gate coupling phenomena occurs most pronouncedly, although not exclusively, between sets of adjacent storage elements that have been programmed at different times. For example, a first storage element can be programmed to add a level of charge to its floating gate that corresponds to a set of data. Subsequently, one or more adjacent storage elements are programmed to add a level of charge to their floating gates that correspond to a set of data. After one or more of the adjacent storage elements are programmed, the charge level read from the first storage element may appear to be different than when it was programmed because of the effect of the charge on the adjacent storage elements(s) being coupled to the first storage element. The coupling from adjacent storage elements can shift the apparent charge level being read from a selected storage element by a sufficient amount to lead to an erroneous reading of the stored data.

Moreover, as storage elements continue to shrink in size, the natural programmed and erase distributions of threshold voltages are expected to increase due to short channel effects, greater oxide thickness/coupling ratio variations and more channel dopant fluctuations, reducing the available separation between adjacent states. The reduction of the space between word lines and between bit lines will also increase the coupling between adjacent floating gates. The effect of the floating gate-to-floating gate coupling is of greater concern for multi-state devices because the allowed threshold voltage ranges and the forbidden ranges (range between two distinct threshold voltage ranges that represent distinct memory states) are narrower than in binary devices. Therefore, floating gate-to-floating gate coupling can result in storage elements being shifted from an allowed threshold voltage range to a forbidden range. Read errors can result.

BRIEF DESCRIPTION OF THE DRAWINGS

FIG. 16a depicts voltages applied to a word line WLn+1 during the read operation, where different sets of pass voltages are applied for different control gate read voltages on WLn.

FIG. 16b depicts voltages applied to WLn during the read operation.

FIG. 16c depicts voltages applied to other unselected word lines during the read operation.

FIG. 17a depicts voltages applied to a word line WLn+1 during a read operation, where different sets of pass voltages are applied to WLn+1 for different control gate read voltages on WLn, and the pass voltages are adjusted based on a number of program-erase cycles.

FIG. 17b depicts voltages applied to a word line WLn+1 during a read operation, where a common set of pass voltages is applied to WLn+1 for different control gate read voltages on WLn, and the pass voltages are adjusted based on a number of program-erase cycles.

DETAILED DESCRIPTION

A method and non-volatile storage system are provided in which read operations for selected storage elements compensate for coupling which has been experienced by the selected storage elements. The compensation can be based on a number of program-erase cycles, and/or states of the selected storage elements.

Figure 1A:
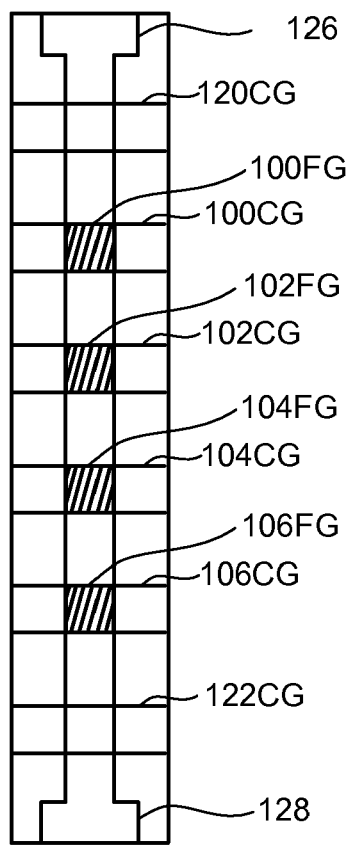
FIG. 1a is a top view of a NAND string.
Figure 1B:
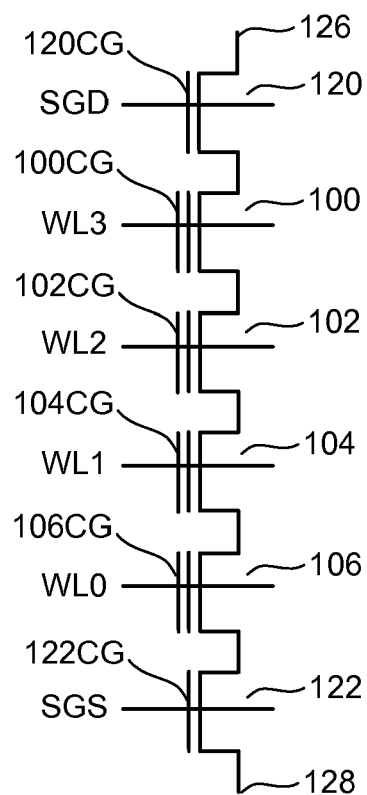
FIG. 1b is an equivalent circuit diagram of the NAND string.

One example of a memory system suitable for implementing the present technology uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
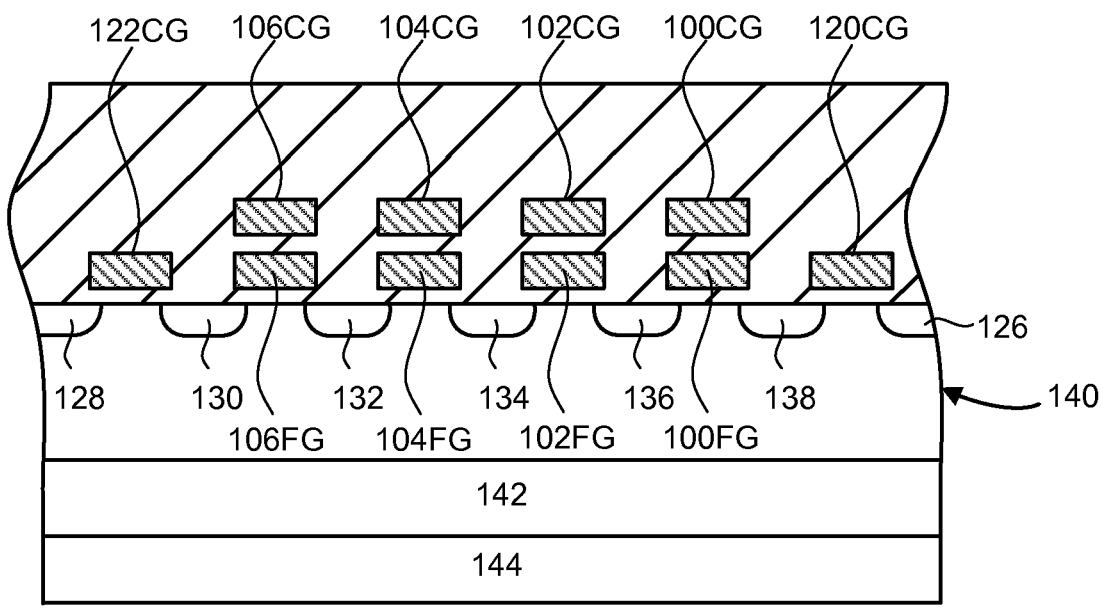
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "1." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semiconductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
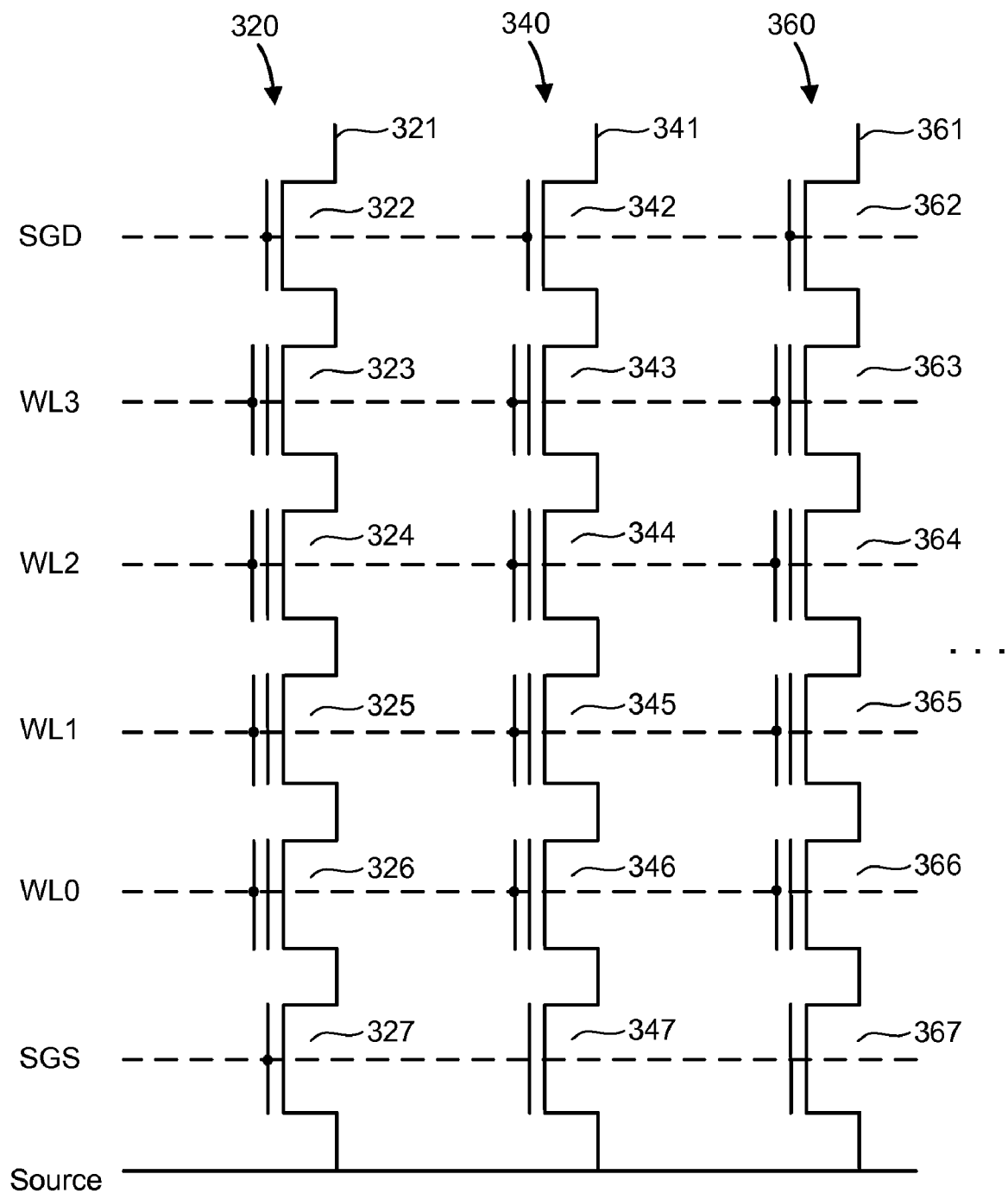
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
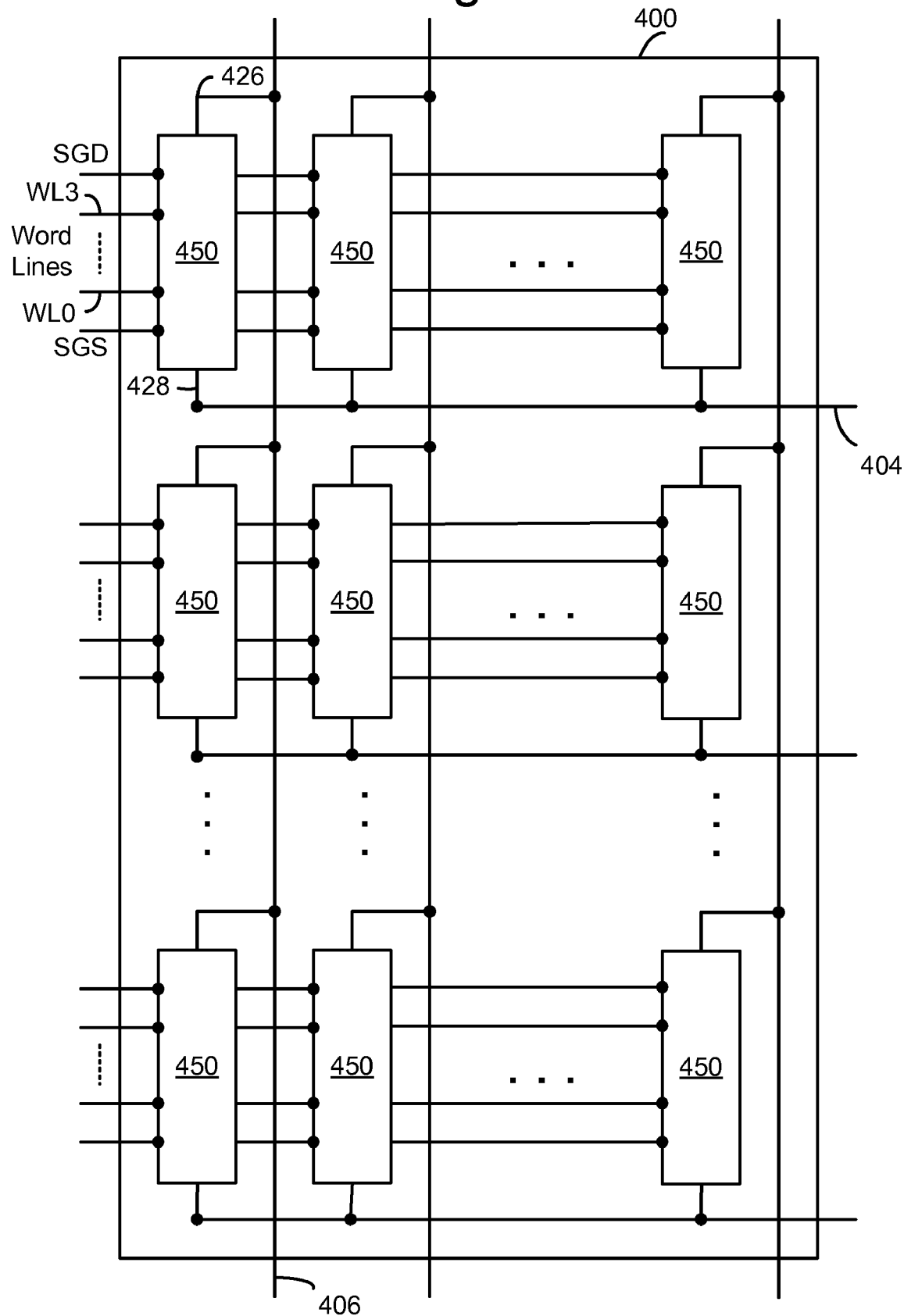
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
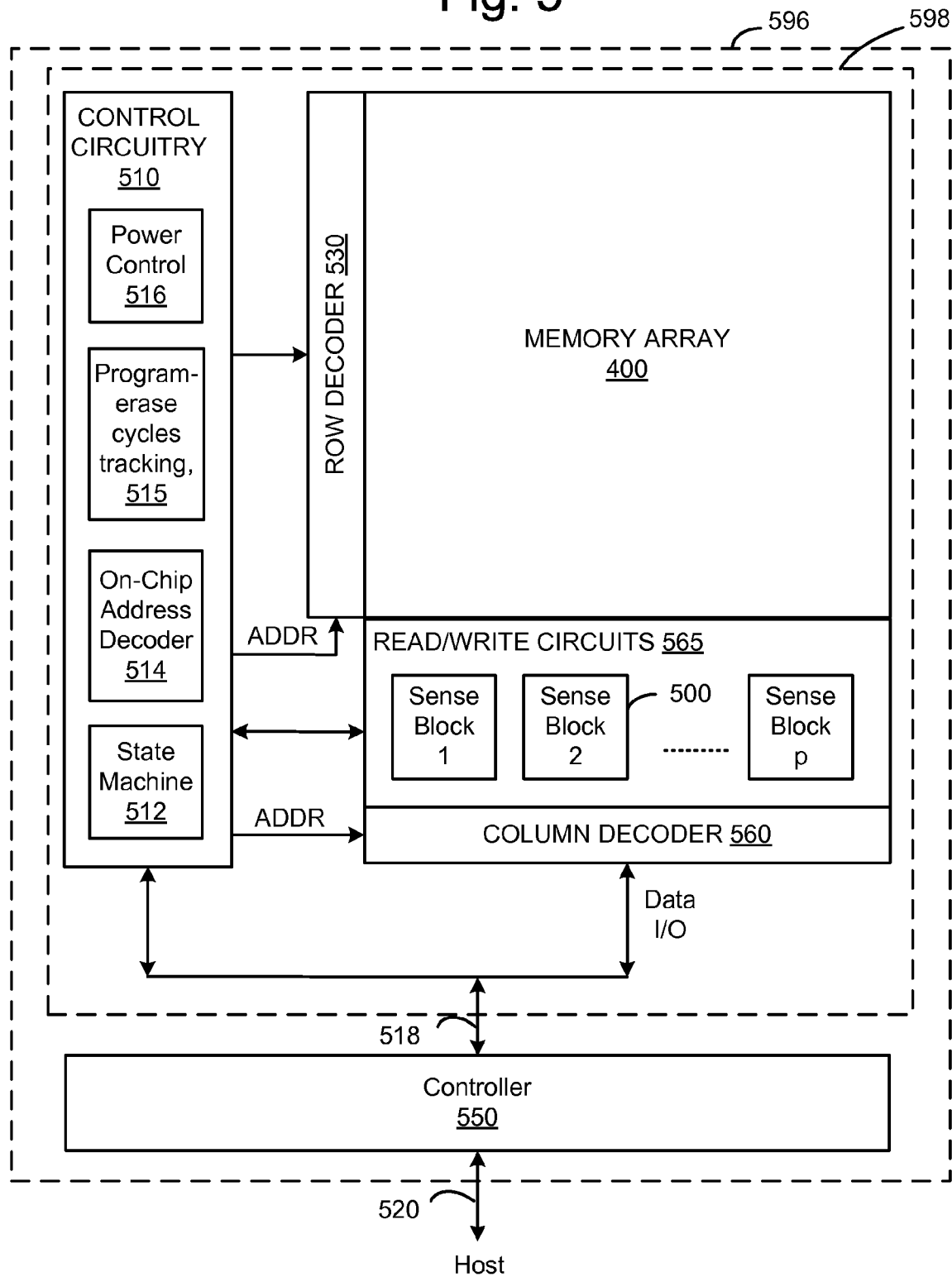
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment of the present technology. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, a temperature sensing circuit 515 and a power control module 516. The state machine 512 provides chip-level control of memory operations. The on-chip address decoder 514 provides an address interface between that used by the host or a memory controller to the hardware address used by the decoders 530 and 560. The program-erase cycle tracking circuit 515 can be used for tracking a number of program-erase cycles which have been experienced by each of different blocks of the memory array. The number of program-erase cycles can be used to set pass voltages during read operations, as discussed herein. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, tracking circuit 515, power control 516, sense blocks 500, read/write circuits 565, controller 550, etc.

In another embodiment, a non-volatile memory system uses dual row/column decoders and read/write circuits. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
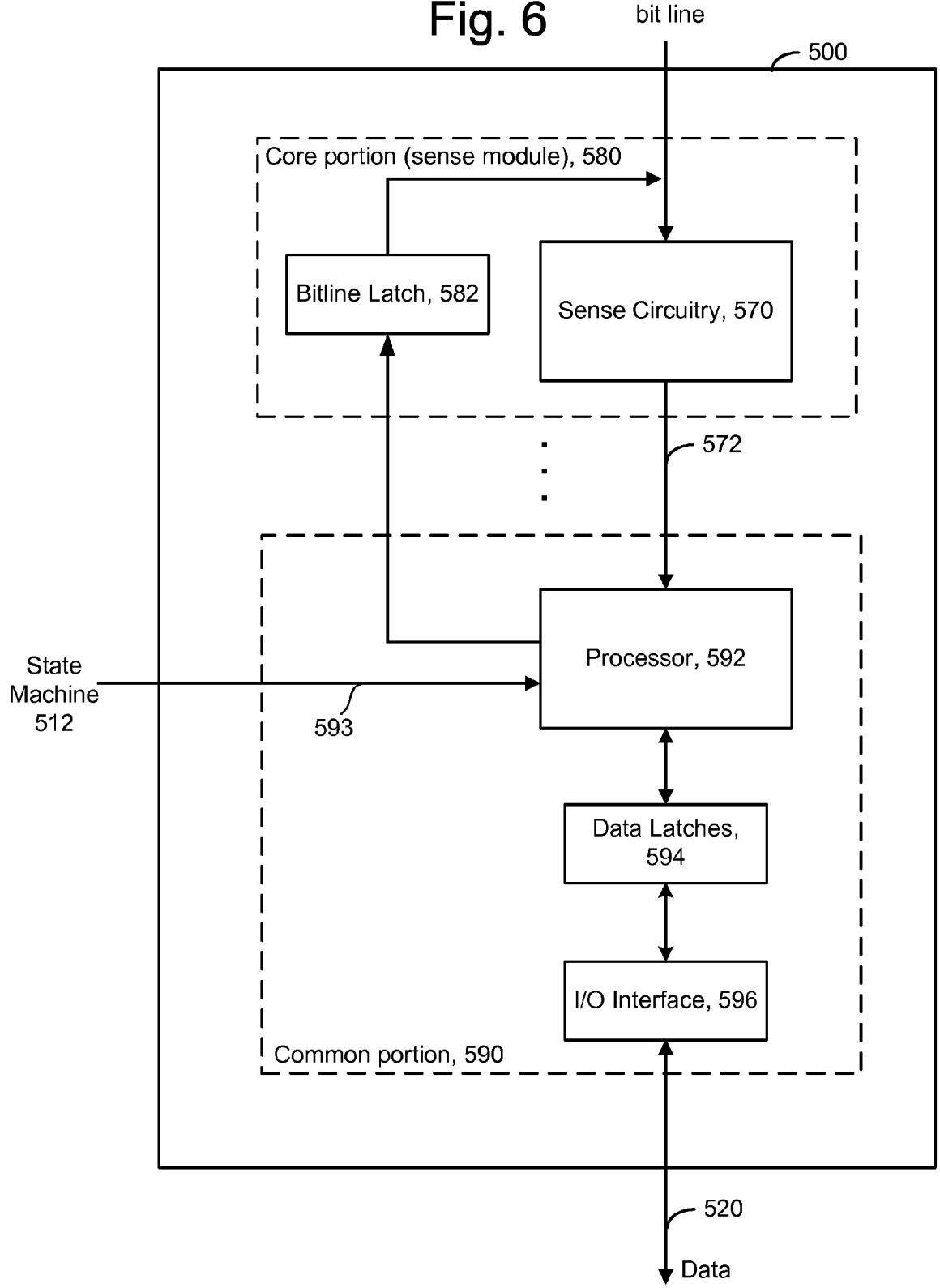
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 512 that controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594 from the data bus 520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if programming pulses appear on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are three data latches per sense module 580. In some implementations (but not required), the data latches are implemented as a shift register so that the parallel data stored therein is converted to serial data for data bus 520, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7:
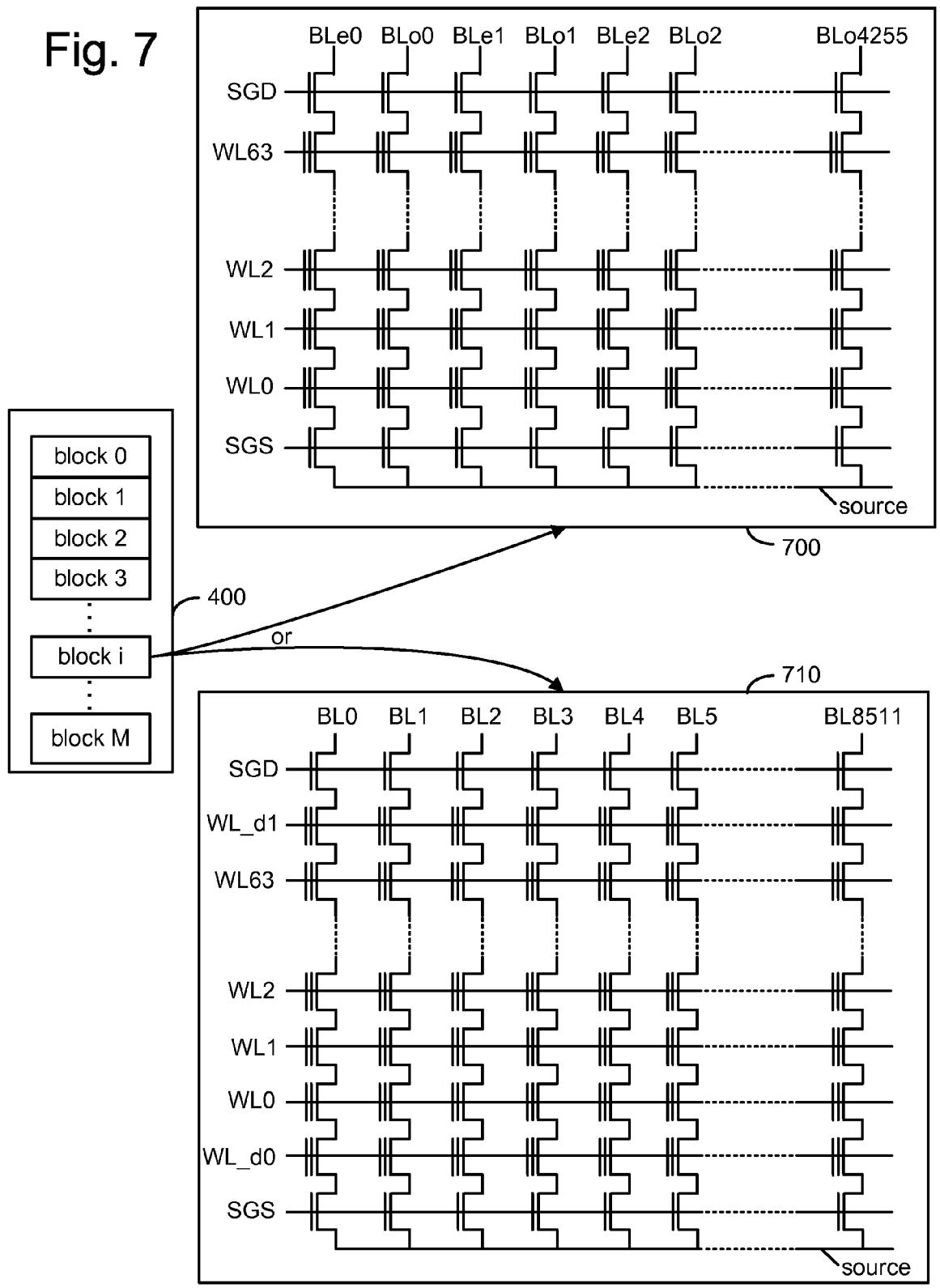
FIG. 7 illustrates an example of an organization of a memory array into blocks for an all bit line memory architecture or for an odd-even memory architecture.

FIG. 7 illustrates an example of an organization of a memory array into blocks for an all bit line memory architecture or for an odd-even memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 710), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 700), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 8:
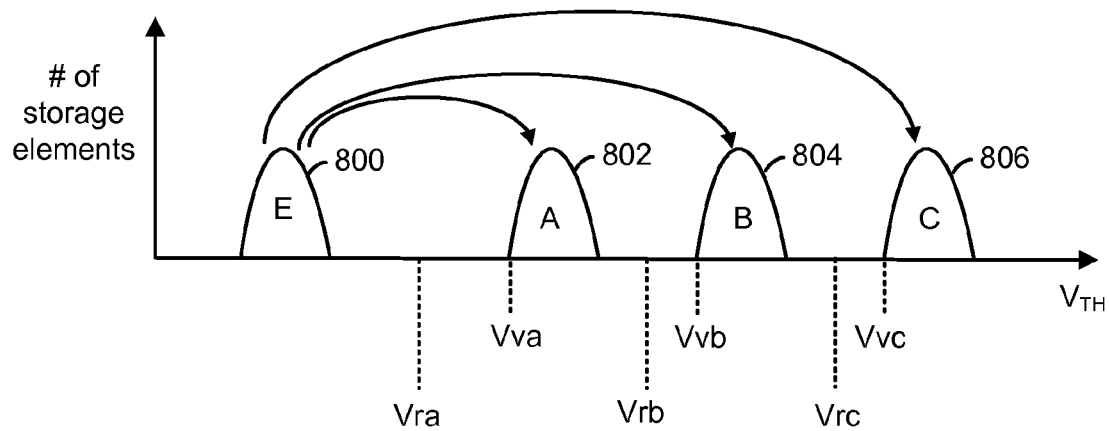
FIG. 8 depicts an example set of threshold voltage distributions and one-pass programming.

FIG. 8 depicts an example set of threshold voltage distributions and one-pass programming. Example threshold voltage distributions for the storage element array are provided for a case where each storage element stores two bits of data. A first threshold voltage distribution 800 is provided for erased (E state) storage elements. Three threshold voltage distributions 802, 804 and 806 represent programmed states A, B and C, respectively. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present technology can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in. Vra, Vrb and Vrc can also be considered to be state-demarcating voltages because they demarcate or provide boundaries of threshold voltage distributions of different states.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 12 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 9:
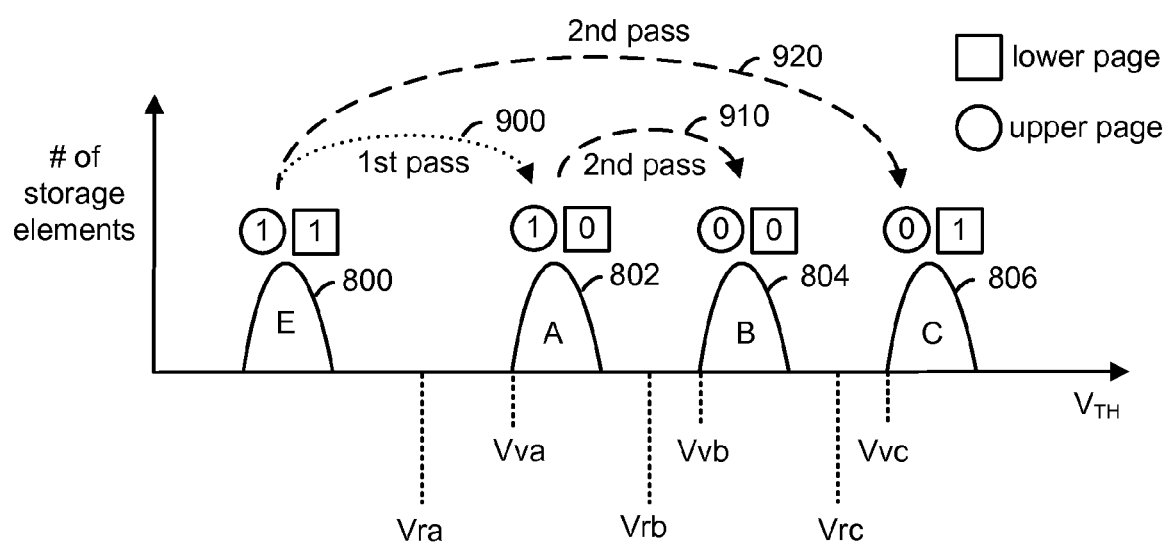
FIG. 9 depicts an example set of threshold voltage distributions and two-pass programming.

FIG. 9 illustrates an example of a two-pass technique of programming a multi-state storage element that stores data for two different pages: a lower page and an upper page. Four states are depicted by repeating the threshold voltage distributions 800, 802, 804 and 806 from FIG. 8. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 920. If the storage element had been programmed into state A as a result of the first programming pass, then the storage element is further programmed in the second pass so that the threshold voltage is increased to be within state B, as depicted by arrow 910. The result of the second pass is to program the storage element into the state designated to store a logic "0" for the upper page without changing the data for the lower page. In both FIG. 8 and FIG. 9, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Figure 10A:
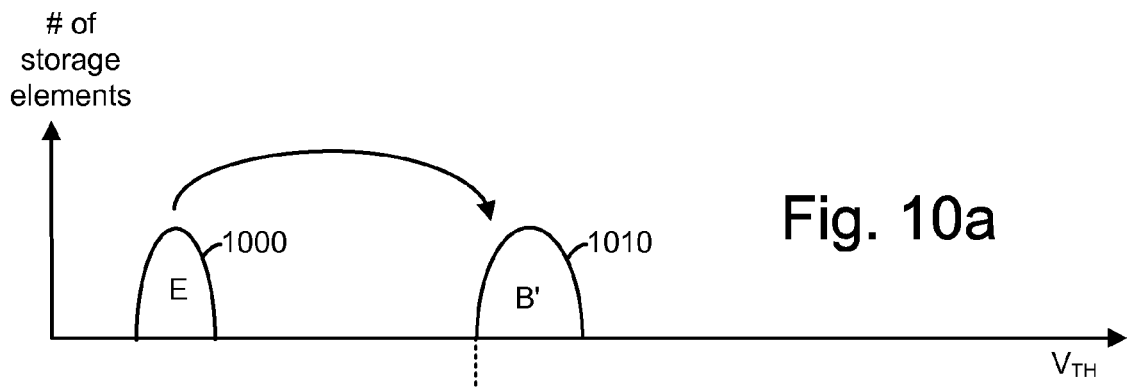
FIGS. 10a-c show various threshold voltage distributions and describe a process for programming non-volatile memory.
Figure 10B:
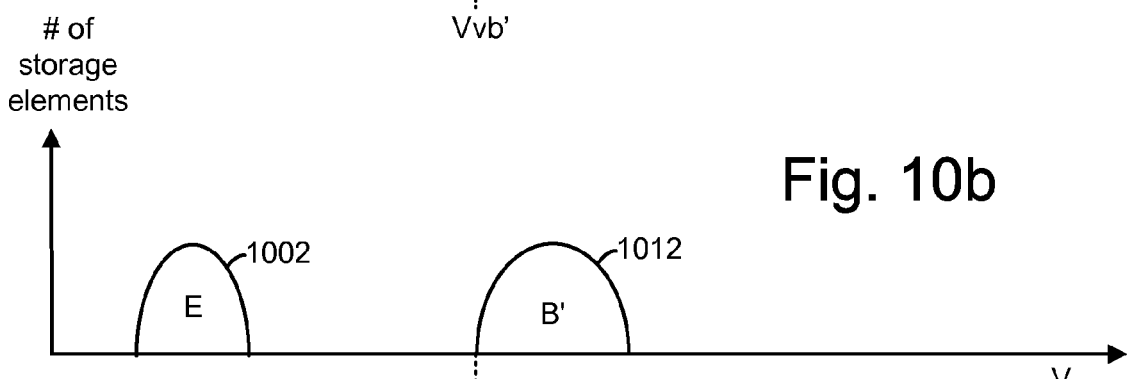
Figure 10C:
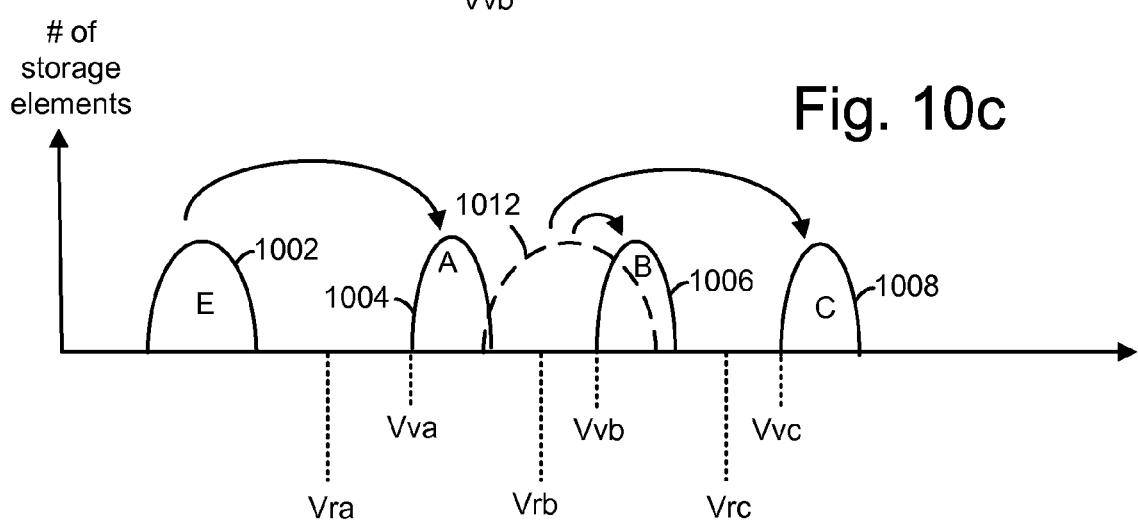

FIGS. 10a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 1000). If the data is to be programmed to 0, then the threshold of voltage of the storage element is raised such that the storage element is programmed to state B' (distribution 1010). FIG. 10*a* therefore shows the programming of storage elements from state E to state B'. State B' is an interim state B; therefore, the verify point is depicted as Vvb', which is lower than Vvb.

Note that the distribution 1010 can have an associated temporary or interim distribution (not shown) which the B' state storage elements undergo before reaching the distribution 1010.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1012 of FIG. 10*b*. This apparent widening of the threshold voltage distribution will be remedied when programming the upper page. The E state may also be widened, to a lesser extent, as depicted by distribution 1002.

FIG. 10*c* depicts the process of programming the upper page. If the storage element is in erased state E and the upper page is to remain at 1, then the storage element will remain in state E (distribution 1002). If the storage element is in state E and its upper page data is to be programmed to 0, then the threshold voltage of the storage element will be raised so that the storage element is in state A (distribution 1004). If the storage element was in intermediate threshold voltage distribution 1012 and the upper page data is to remain at 1, then the storage element will be programmed to final state B (distribution 1006). If the storage element is in intermediate threshold voltage distribution 1012 and the upper page data is to become data 0, then the threshold voltage of the storage element will be raised so that the storage element is in state C (distribution 1008). The process depicted by FIGS. 10*a-c* reduces the effect of floating gate to floating gate coupling because only the upper page programming of neighbor storage elements will have an effect on the apparent threshold voltage of a given storage element. An example of an alternate state coding is to move from distribution 1012 to state C when the upper page data is a 1, and to move to state B when the upper page data is a 0.

Note that the distributions 1004, 1006 and 1008 can have associated temporary or interim distributions which the A, B and C state storage elements undergo as they transition to the final distributions 1004, 1006 and 1008, respectively.

Although FIGS. 10*a-c* provide an example with respect to four data states and two pages of data, the concepts taught can be applied to other implementations with more or fewer than four states and more or less than two pages. For example, memory devices with eight or sixteen states per storage element are currently planned or in production.

Figure 11:
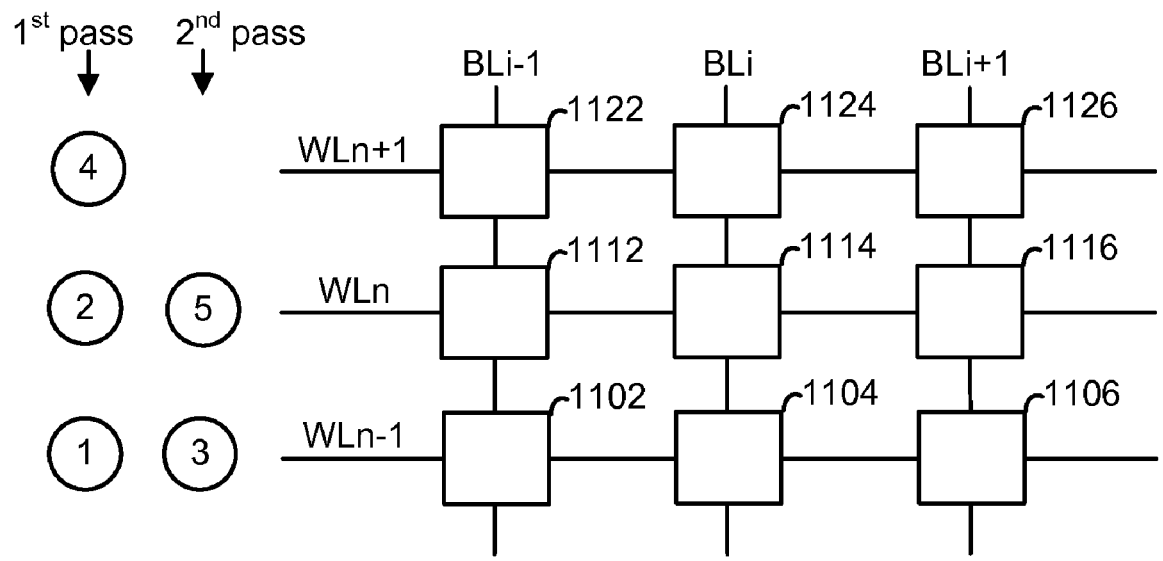
FIG. 11 depicts a set of storage elements during a multi-pass programming operation.

FIG. 11 depicts a set of storage elements during a multi-pass programming operation. The components depicted may be a subset of a much larger set of storage elements, word lines and bit lines. In one possible programming operation, storage elements on WLn−1, e.g., storage elements 1102, 1104 and 1106, are programmed in a first programming pass. This step is represented by the circled "1." Next, referring to the circled "2", storage elements on WLn, e.g., storage elements 1112, 1114 and 1116, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next, referring to the circled "3", storage elements on WLn−1 are programmed in a second programming pass. Next, referring to the circled "4", storage elements on WLn+1 are programmed in a first programming pass. Next, referring to the circled "5", the storage elements on WLn are programmed in a second programming pass to their final respective states.

Due to the programming on WLn+1, the storage elements on WLn are affected by coupling which tends to raise and widen their threshold voltage distribution for each state. This can occur during both single-pass and multi-pass programming. In single-pass pass programming, each word line is programmed completely before moving to the next word line, e.g., WLn−1, then WLn, then WLn+1. See also FIG. 13.

Figure 12:
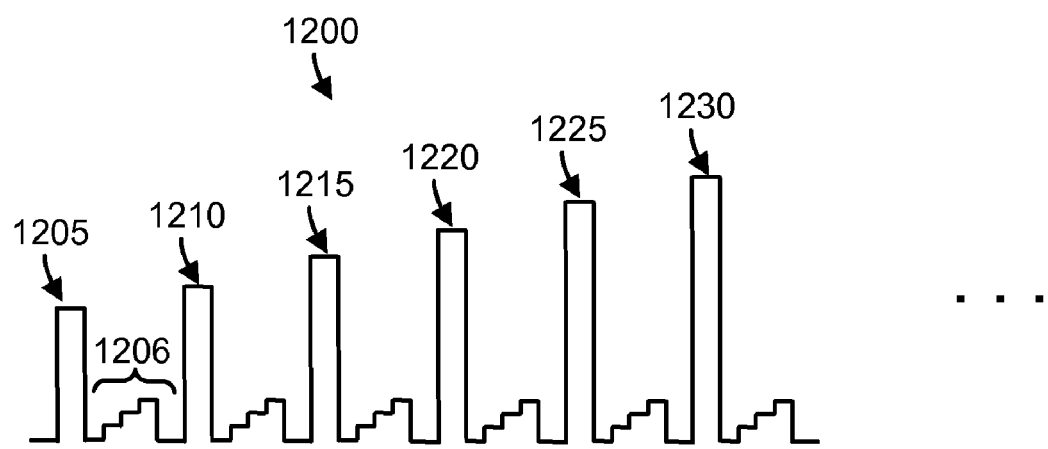
FIG. 12 depicts a pulse train applied to the control gates of storage elements during programming.

FIG. 12 depicts an example pulse train 1200 applied to the control gates of storage elements during programming. The pulse train includes program pulses 1205, 1210, 1215, 1220, 1225, 1230... which step up in amplitude, and a set of verify pulses between each program pulse, including example verify pulses 1206, such as Vva, Vvb and Vvc, e.g., as discussed in connection with FIGS. 8, 9 and 10*c*. The pulses can be fixed in amplitude, or they can step up at a fixed or varying rate, for instance. In one approach, the same pulse train is used for each programming pass. However, it is also possible to use a different pulse train in the different programming passes. For example, a second programming pass may use a pulse train which starts at a higher initial level than the first pass.

In one embodiment, the programming pulses have a voltage which starts at 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses.

The pulse train 1200 may be used during all bit line programming, for instance, or during even-odd programming. During all bit line programming, storage elements of even- and odd-numbered bit lines are programmed together, and verified together. During one type of even-odd programming, storage elements of even-numbered bit lines are programmed and verified using repeated applications of the pulse train 1200, followed by storage elements of odd-numbered bit lines being programmed and verified using repeated applications of the pulse train 1200. In another type of programming, storage elements of even- and odd-numbered bit lines are programmed together, but the verify operation is performed separately, e.g., first for the even-numbered bit lines and then for the odd-numbered bit lines.

Figure 13:
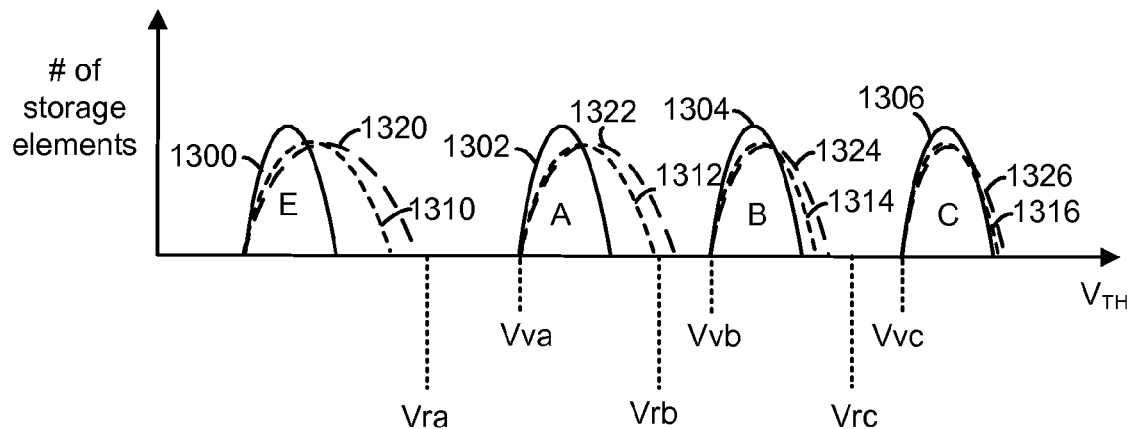
FIG. 13 depicts set of threshold voltage distributions illustrating the effects of floating coupling during programming, for different amounts of program-erase cycles.

FIG. 13 depicts set of threshold voltage distributions illustrating the effects of floating coupling during programming, for different amounts of program-erase cycles. As mentioned, coupling can raise the threshold voltage of a storage element after it has been programmed. The coupling on storage element on WLn is caused mainly by programming of an adjacent, same bit line storage element on the drain side word line WLn+1. Such coupling can occur in single-pass or multi-pass programming. The horizontal axis depicts the threshold voltage for storage elements on WLn and the vertical axis depicts a number of storage elements.

Distributions 1300, 1302, 1304 and 1306 depict an erase (E) state, A state, B state and C state, respectively, for a row (WLn) of storage elements before the drain-side, same bit line, adjacent word line (WLn+1) is programmed. At this point, the threshold voltage distributions have not yet been widened due to coupling from programming of the drain-side adjacent word line. Distributions 1310, 1312, 1314 and 1316 depict the erase (E) state, A state, B state and C state distributions, respectively, after coupling, when the WLn storage elements have a relatively low amount of program-erase cycles. Distributions 1320, 1322, 1324 and 1326 depict the erase (E) state, A state, B state and C state, respectively, after coupling, when the WLn storage elements have a relatively high amount of program-erase cycles. The coupling is greater with a higher number of program-erase cycles.

Each distribution on WLn is widened as a result of adding negative charge to the floating gates of the storage elements of the adjacent word line. Because of floating gate coupling, the negative charge of a later-programmed storage element on WLn+1 will raise the apparent threshold voltage of an adjacent storage element on WLn that is connected to the same bit line. Because the distributions are widened, storage elements on WLn may be read incorrectly as if they were in an adjacent state. Generally, storage elements at the upper end of each distribution can have an apparent threshold voltage above a corresponding read compare point. For example, when applying reference voltage Vrb, certain storage elements programmed to state A may not conduct sufficiently because of the shift in their apparent threshold voltage. These storage elements may incorrectly be read as if they were in state B, causing read errors. The later programmed storage element can also affect the apparent threshold voltage of storage elements of WLn that are connected to different bit lines, such as those connected to adjacent bit lines.

To compensate for the widened threshold voltage distributions, read pass voltages are applied to unselected word line when reading storage elements on a selected world line. The pass voltages on the control gate of WLn−1 and WLn+1 are coupled to the floating gate of WLn, so that the potential of storage elements on WLn is higher. With a higher floating gate potential, a lower control gate voltage can make the storage elements conductive, so effectively the threshold voltage decreases. A goal is to cancel out the increase in threshold voltage on WLn which is caused by coupling by its neighbors by applying an appropriate compensating pass voltage on WLn−1 and WLn+1 which can reduce the threshold voltage.

Figure 14:
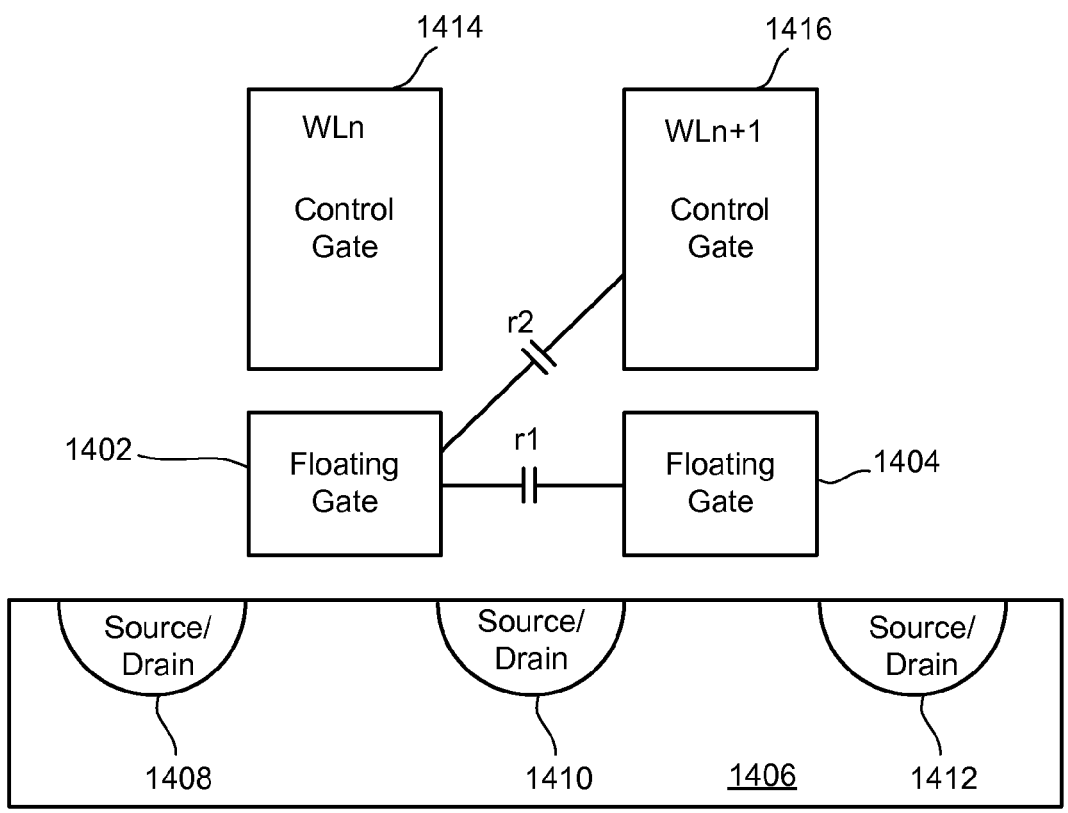
FIG. 14 provides a cross section of NAND strings, and depicts coupling during programming.

FIG. 14 is a cross section of NAND strings, and depicts coupling during programming. Neighboring floating gates 1402 and 1404, which are on the same NAND string, are located above NAND channel/substrate 1406, which has source/drain regions 1408, 1400 and 1412. Above floating gate 1402 is control gate 1414 that is connected to word line WLn. Above floating gate 1404 is control gate 1416 that is connected to word line WLn+1. In some cases, the control gates form the word lines while in other cases, the word lines are formed separately and then connected to the control gates. Although floating gate 1402 will likely be subject to coupling from multiple other floating gates, for simplicity only the effects from one neighboring memory cell are depicted. FIG. 14 depicts two components of coupling being provided to floating gate 1402 from its neighbor. Component r1 is the coupling from the floating gate 1404, and refers to a ratio or portion of a potential on control gate 1416 which is coupled to floating gate 1402. Component r2 is the coupling from the control gate 1416, and refers to a ratio or portion of a potential on floating gate 1404 which is coupled to floating gate 1402.

Figure 15A:
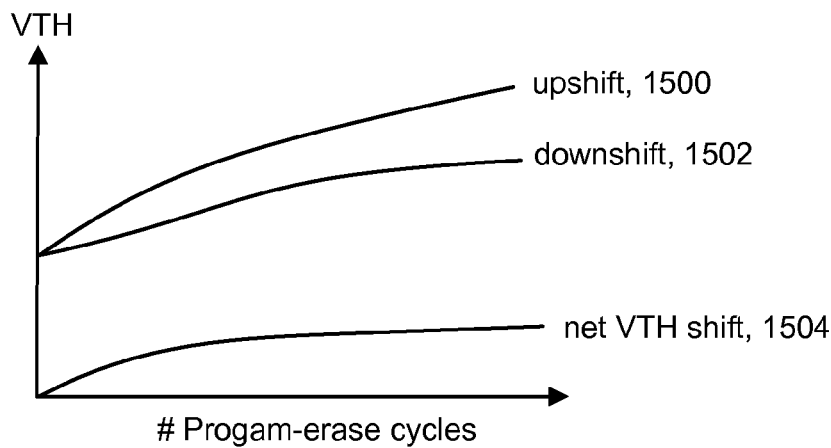
FIG. 15a depicts a graph showing a change in threshold voltage for a storage element on word line WLn based on a number of program-erase cycles.

FIG. 15a depicts a graph showing a change in threshold voltage for a storage element on a word line WLn based on a number of program-erase cycles. Coupling effects gradually increase with the number of program-erase (write-erase) cycles. This is believed to be caused by charge trapping and the existence of parasitic storage elements after program-erase cycling. These factors tend to enhance VTH interference between neighboring storage elements. Moreover, this interference is expected to worsen as memory devices become smaller. A program-erase cycle occurs when a block or other unit of storage elements undergoes programming and is subsequently erased after some period of time, such as when the data which is stored in the block is no longer needed or is moved.

In the graph, the horizontal axis depicts a number of program-erase cycles, and the vertical axis depicts a threshold voltage of a storage element. Curve 1500 depicts an upshift or increase in VTH for a storage element which is caused by coupling due to programming of a neighboring drain side storage element. Curve 1502 depicts a downshift in VTH for the storage element which is caused by pass voltages applied to the neighboring word lines. Curve 1504 detects the net VTH shift, and is the difference between curves 1500 and 1502. Ideally, the net shift should be kept near 0 V. If the pass voltages are optimized for a fresh memory device, which has a low number of program-erase cycles, the net shift will become less optimal as the number of program-erase cycles increases. A better solution is to adjust the pass voltages as a function of the number of program-erase cycles.

The net VTH shift can vary depending on the state transition which occurs when WLn+1 is programmed. A large transition, such as programming from state E to C will cause a larger shift on WLn than a smaller transition, such as programming from state E to A.

Figure 15B:
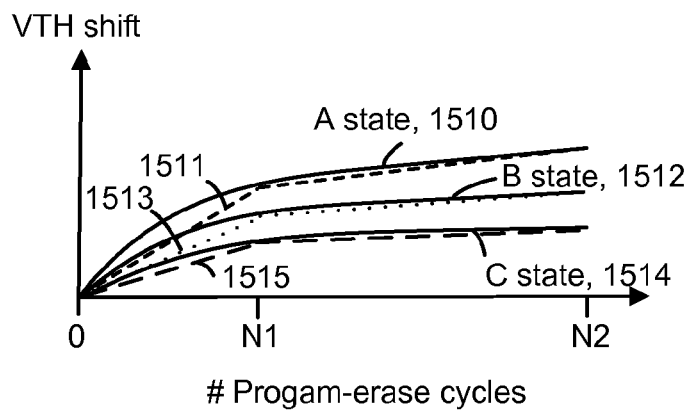
FIG. 15b depicts a graph showing a change in threshold voltage for a storage element on word line WLn based on a state of the storage element, and based on number of program-erase cycles.

FIG. 15b depicts a graph showing a change in threshold voltage for a storage element on WLn based on a state of the storage element, and based on number of program-erase cycles. In addition to the net VTH shift on WLn varying based on the state transition which occurs when WLn+1 is programmed, the net VTH shift on WLn can also vary based on the data state on WLn. Generally, there will be a smaller shift when the data state on WLn is higher, corresponding to a higher VTH. Curves 1510, 1512 and 1514 depicts a VTH shift for storage element on WLn for A state, B state and C state storage elements, respectively, for a given state transition on WLn+1. In this example, there are four data states. The concepts herein apply to schemes which use additional states as well. Curves 1510, 1512 and 1514 are analogous to curve 1504 of FIG. 15a. The curves 1510, 1512 and 1514 can be modeled by linear traces 1511, 1513 and 1515, respectively. Each linear trace has a first portion which extends between 0 and N1 program erase cycles and a second portion which extends N1 and N2 program erase cycles. N1 and N2 are values which can be determined by characterizing a particular memory device design.

Figure 15C:
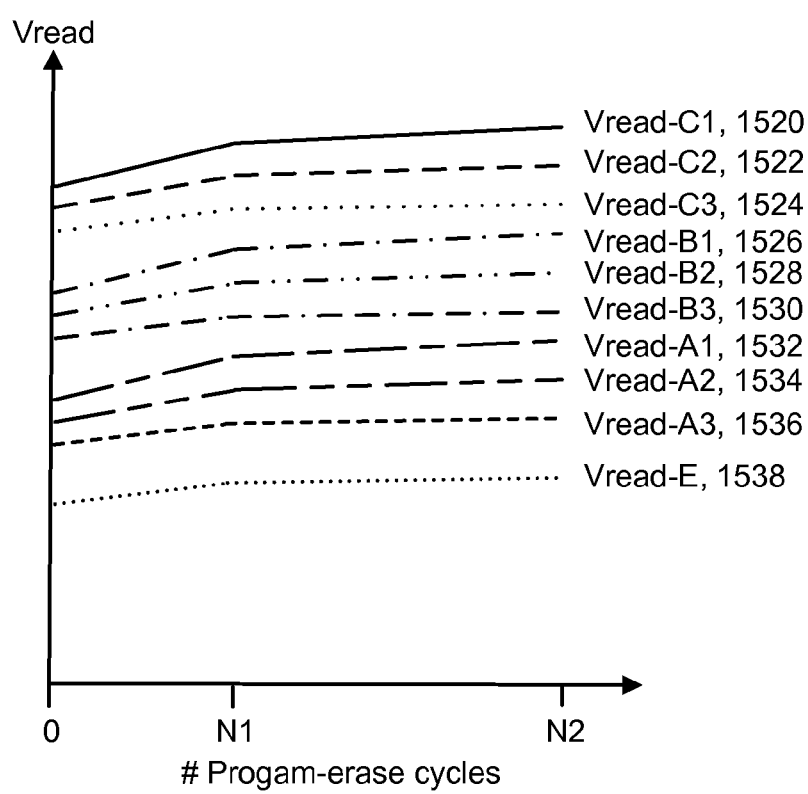
FIG. 15c depicts a graph showing read pass voltages for a word line WLn+1 for different states of a storage element on WLn, based on number of program-erase cycles.

FIG. 15c depicts a graph showing read pass voltages for a word line WLn+1 for different states of a storage element on WLn, based on number of program-erase cycles. By applying these different read pass voltages on WLn+1, the net VTH shift on WLn can be minimized so that read errors are reduced. In particular, referring also to FIGS. 16a and 16b, for each control gate read voltage which is applied to a selected word line WLn, a set of pass voltages is applied to WLn+1. In a set of pass voltages, each pass voltage corresponds to a particular data state for a storage element on WLn+1, and is set to minimize the VTH shift which is experienced by an adjacent storage element on WLn. Furthermore, a different set of pass voltages can be applied for each control gate read voltage to minimize the VTH shift which is experienced on WLn. Generally, for a pass voltage which corresponds to a given data state on WLn+1, the pass voltage is lower when the data state of the adjacent storage element on WLn is higher, since such higher-state storage elements require less of a compensation by the pass voltage of WLn+1.

In adjusting the pass voltages as a function of the number of program-erase cycles, the pass voltage can increase above an initial level based on a first slope of the associated trace between 0 and N1 cycles, and subsequently increase based on a second slope of the associated trace between N1 and N2 cycles. Here, the first slope is greater than the second slope so that the pass voltage increases at a faster rate between 0 and N1 cycles than between N1 and N2. More than two segments can be used to model the pass voltage vs. cycle relationship if a finer accuracy is desired. In one example, the first slope is twice the second slope. For example, the first slope, or voltage cycle factor, may be 0.5 mV/cycle while the second slope is 0.25 mV/cycle. The controller of the memory device can be configured to increase the read pass voltage by 50 mV after every 100 program-erase cycles between 0 and N1 cycles, for instance. Further, N1=1000 cycles, in one implementation, and N2 represents the highest number of cycles which are experienced in an expected operational lifetime of the memory device. The optimum voltage cycle factors can be designed in parameters which are determined from characterization data of the memory device.

Furthermore, the pass voltage on WLn+1 during a read operation on WLn can be expressed as an absolute value, or in terms of a difference with respect to a lower pass voltage on WLn+1 which is used during a verify operation on WLn. This difference can be, e.g., 2-3 V.

The pass voltage on WLn−1 can remain at a fixed level since it is programmed before WLn and does not cause coupling errors which need to be corrected as described herein.

In FIG. 15c, the pass voltages which correspond to state C on WLn+1, and to control gate read voltages Vra, Vrb and Vrc (or, similarly, states E/A, A/B and B/C), respectively, on WLn are: Vread-C1 1520, Vread-C2 1522 and Vread-C3 1524, respectively. The pass voltages which correspond to state B on WLn+1, and to control gate read voltages Vra, Vrb and Vrc, respectively, on WLn are: Vread-B1 1526, Vread-B2 1528 and Vread-B3 1530, respectively. The pass voltages which correspond to state A on WLn+1, and to control gate read voltages Vra, Vrb and Vrc, respectively, on WLn are: Vread-A1 1532, Vread-A2 1534 and Vread-A3 1536, respectively. A fixed pass voltages Vread-E 1538 may be used for all control gate read voltages Vra, Vrb and Vrc, respectively, on WLn, in one possible approach, since a state E storage element does not cause different amounts of coupling to WLn based on the state of a storage element on WLn.

Note that while FIG. 15c depicts no overlap among the pass voltages, overlap is possible. Moreover, the differences between the pass voltages need not be uniform or exactly as depicted.

Figure 16A:
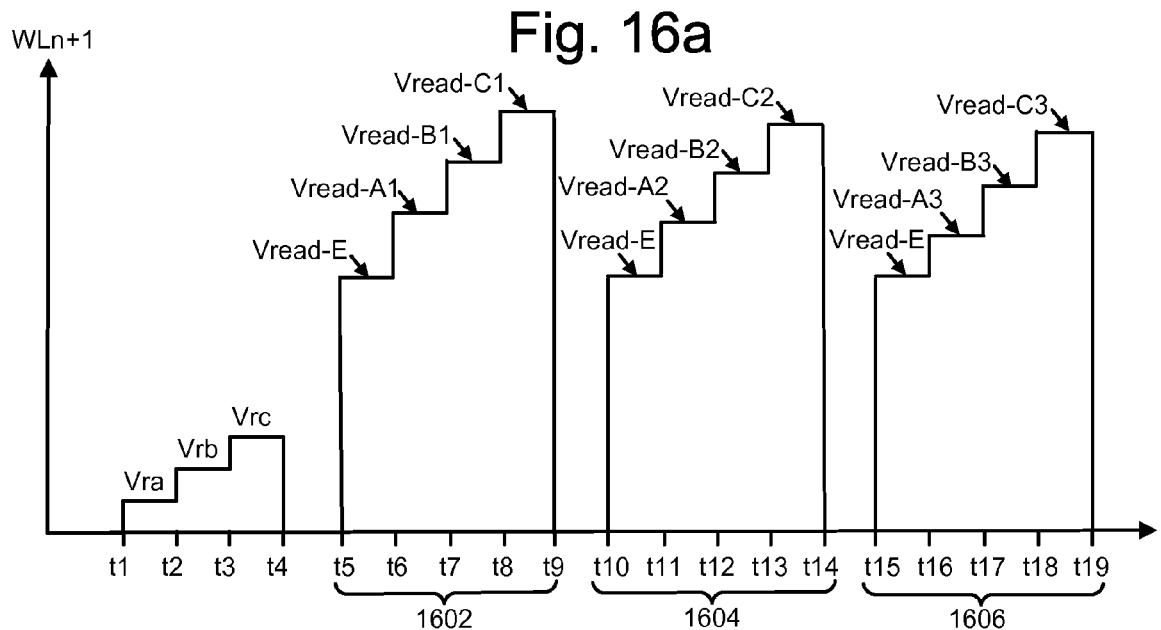
FIGS. 16a-c depict voltages applied to selected and unselected word lines during a read operation for the selected word line, WLn.
Figure 16B:
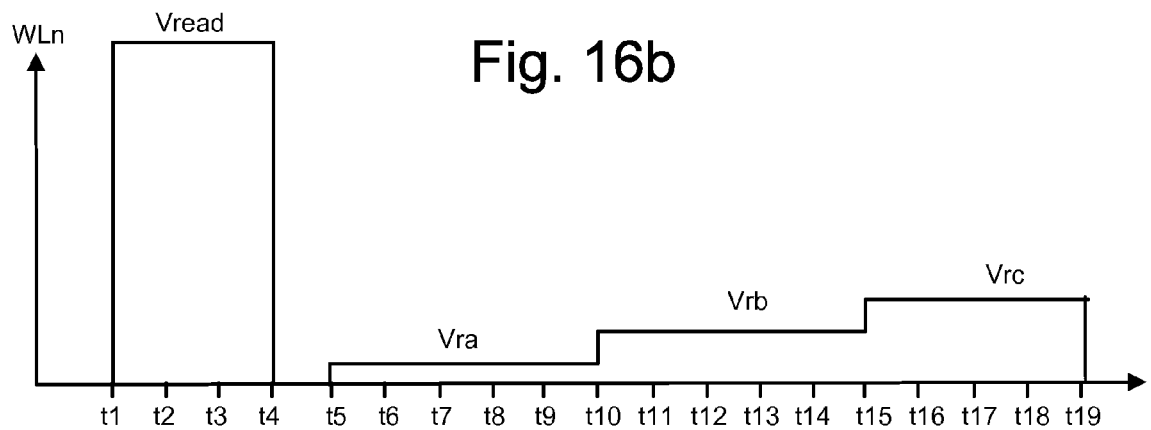
Figure 16C:
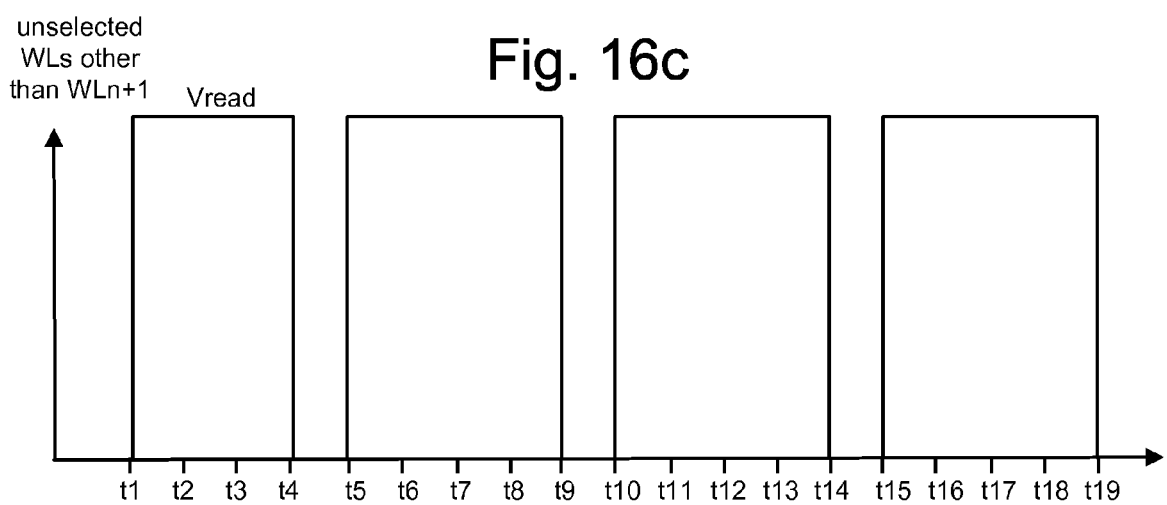

FIGS. 16a-c depict voltages applied to selected and unselected word lines during a read operation for the selected word line, WLn. In particular, FIG. 16a depicts voltages applied to a word line WLn+1 during the read operation for WLn, where different sets of pass voltages are applied for different control gate read voltages on WLn. Each set of read pass voltages is different, at least in part. FIG. 16b depicts voltages applied to WLn during the read operation. FIG. 16c depicts voltages applied to other unselected word lines during the read operation.

The horizontal axis depicts time and the vertical axis depicts voltage. The drawings are not necessarily to scale. A read operation for WLn can involve initially reading WLn+1 between t1-t4 by applying different control gate read voltages, Vra, Vrb and Vrc, in turn, to WLn+1 (FIG. 16a). A baseline pass voltage Vread is applied to the unselected word lines, including WLn (FIG. 16b) and the other unselected word lines (FIG. 16c). In this example, there are four possible data states, but additional states may be used. When Vra, Vrb and Vrc are each applied to WLn+1, a sensing operation takes place for one or more bit lines which determines whether the associated storage element on WLn+1 is conductive or non-conductive. That is, sensing occurs from t1-t2, from t2-t3 and from t3-t4. If a storage element becomes conductive when Vra is applied, the storage element is in the E state. If a storage element becomes conductive when Vrb is applied, the storage element is in the A state. If a storage element becomes conductive when Vrc is applied, the storage element is in the B state. If a storage element is still not conductive when Vrc is applied, the storage element is in the C state. The data state of the storage elements on WLn+1 is stored at t4 after it is ascertained.

Subsequently, at t5, a sensing process begins at WLn. Initially, the control gate voltage Vra is applied to WLn from t5-t10. Each control gate voltage is applied for a longer period of time compared to the control gate voltages applied to WLn+1 from t1-t4 because sensing is performed multiple times for each control gate voltage. In particular, a first set 1602 of read pass voltages is applied on WLn+1, and sensing occurs for each read pass voltage in the set. These voltages can be considered to be compensating voltages because they compensate for coupling which has occurred on WLn.

Specifically, sensing occurs from t5-t6 with Vread-E applied to WLn+1, sensing occurs from t6-t7 with Vread-A1 applied to WLn+1, sensing occurs from t7-t8 with Vread-B1 applied to WLn+1, and sensing occurs from t8-t9 with Vread-C1 applied to WLn+1. From t5-t9, for a given storage element on WLn, a result of only one of the multiple sensing operations is used. This is the sensing operation for which the read pass voltage on WLn+1 corresponds to the state of the adjacent storage element on WLn+1. For example, in FIG. 11, if the sensing on WLn+1 indicates that storage element 1124 is in the A state, then, while Vra is applied on WLn, only the result from the sensing of storage element 1114 from t6-t7 is used, in which Vread-A1 is applied to WLn+1.

Subsequently, the control gate voltage Vrb is applied to WLn from t10-t15. A second set 1604 of read pass voltages is applied to WLn+1, and sensing occurs for each read pass voltage. Specifically, sensing occurs from t10-t11 with Vread-E applied to WLn+1, sensing occurs from t11-t12 with Vread-A2 applied to WLn+1, sensing occurs from t12-t13 with Vread-B2 applied to WLn+1, and sensing occurs from t13-t14 with Vread-C2 applied to WLn+1. From t10-t14, for a given storage element on WLn, a result of only one of the multiple sensing operations is used. This is the sensing operation for which the read pass voltage on WLn+1 corresponds to the state of the adjacent storage element. Continuing the above example, where the adjacent WLn+1 storage element is in the A state, then, while Vrb is applied on WLn, only the result from the sensing of storage element 1114 from t11-t12 is used, in which Vread-A2 is applied.

Subsequently, the control gate voltage Vrc is applied to WLn from t15-t19. A third set 1606 of read pass voltages is applied to WLn+1, and sensing occurs for each read pass voltage. Specifically, sensing occurs from t15-t16 with Vread-E applied to WLn+1, sensing occurs from t16-t17 with Vread-A3 applied to WLn+1, sensing occurs from t17-t18 with Vread-B3 applied to WLn+1, and sensing occurs from t18-t19 with Vread-C3 applied to WLn+1. From t15-t19, for a given storage element on WLn, a result of only one of the multiple sensing operations is used. This is the sensing operation for which the read pass voltage on WLn+1 corresponds to the state of the adjacent storage element. Continuing the above example, where the adjacent WLn+1 storage element is in the A state, then, while Vrb is applied on WLn, only the result from the sensing of storage element 1114 from t16-t17 is used, in which Vread-A3 is applied.

In one implementation, Vread-C1>Vread-C2>Vread-C3, Vread-B1>Vread-B2>Vread-B3, and Vread-A1>Vread-A2>Vread-A3. However, in other approaches, the same read pass voltage is used in two or more of the sets of read pass voltages. For example, Vread-C2 may be used from t13-t14 and t18-t19 if the results, e.g., number of read errors, are acceptable. Another possibility is to use Vread-C1 from t8-t9, t13-t14 and t18-t19 if the results are acceptable. Its is also possible to use a common read pass voltage Vread-A in place of Vread-A1, Vread-A2 and Vread-A3, to use a common read pass voltage Vread-B in place of Vread-B1, Vread-B2 and Vread-B3, and to use a common read pass voltage Vread-C in place of Vread-C1, Vread-C2 and Vread-C3.

It is also possible to use the same read pass voltage for two or more states. For example, an implementation which involves eight data states E, A, B, C, D, E, F and G may use a first pass voltage for states E and A, a second, higher pass voltage for states B, C and D, and a third, higher pass voltage for states E, F and G. Various other combinations are possible as well.

While each set of read pass voltages is applied to WLn+1, the other unselected word lines receive the nominal Vread (FIG. 16*c*).

Sensing can occur using any technique. Generally, during sensing, the conduction current of a storage element is measured to determine whether the memory cell became conductive in response to the control gate read voltage applied to the word line. One technique to measure the conduction current is based on the rate at which a dedicated capacitor in a sense amplifier is discharged when the capacitor is coupled to the bit line of the sensed storage element. In another approach, the conduction current of the sensed storage element allows (or fails to allow) the NAND string that includes the storage element to discharge the bit line. The charge on the bit line is measured after a period of time to see whether it has been discharged or not. Appropriate circuitry is provided to store the data state from sensing WLn+1 and use the corresponding result from sensing WLn.

FIG. 17*a* depicts voltages applied to a word line WLn+1 during a read operation, where different sets of pass voltages are applied to WLn+1 for different control gate read voltages on WLn, and the pass voltages are adjusted based on a number of program-erase (PE) cycles. In this example, for each sensing process, two read pass values are depicted which represent extremes in the number of PE cycles: one read pass value for a low number of PE cycles and one read pass value for a high number of PE cycles. In practice, a finer granularity may be used in which a read pass voltage is determined as function of PE cycles using a table look up, interpolation or other technique, based on the discussion of FIG. 15*c*.

Specifically, in the first set 1702 of pass voltages on WLn+1, from t5-t6, Vread-E is applied. From t6-t7, Vread-A1, high PE is applied for a relatively high number of PE cycles, and Vread-A1, low PE is applied for a relatively low number of PE cycles as would be seen in a fresh memory device. From t7-t8, Vread-B1, high PE is applied for high PE cycles, and Vread-B1, low PE is applied for low PE cycles. From t8-t9, Vread-C1, high PE is applied for high PE cycles, and Vread-C1, low PE is applied for low PE cycles.

In the second set 1704 of pass voltages on WLn+1, from t10-t11, Vread-E is applied. From t11-t12, Vread-A2, high PE is applied for high PE cycles, and Vread-A2, low PE is applied for low PE cycles. From t12-t13, Vread-B2, high PE is applied for high PE cycles, and Vread-B2, low PE is applied for low PE cycles. From t13-t14, Vread-C2, high PE is applied for high PE cycles, and Vread-C2, low PE is applied for low PE cycles.

Similarly, in the third set 1706 of pass voltages on WLn+1, from t15-t16, Vread-E is applied. From t16-t17, Vread-A3, high PE is applied for high PE cycles, and Vread-A3, low PE is applied for low PE cycles. From t17-t18, Vread-B3, high PE is applied for high PE cycles, and Vread-B3, low PE is applied for low PE cycles. From t18-t19, Vread-C3, high PE is applied for high PE cycles, and Vread-Cc, low PE is applied for low PE cycles.

FIG. 17*b* depicts voltages applied to a word line WLn+1 during a read operation, where a common set of pass voltages is applied to WLn+1 for different control gate read voltages on WLn, and the pass voltages are adjusted based on a number of program-erase cycles. In this case, the same set of pass voltages is applied to WLn+1 for each value of the control gate read voltage on WLn.

Specifically, in the first set 1712, second set 1714 and third set 1716 of pass voltages on WLn+1, from t5-t6, t10-t11 and t15-t16, respectively, Vread-E is applied. From t6-t7, t11-t12 and t16-t17, Vread-A, high PE is applied for high PE cycles, and Vread-A, low PE is applied for low PE cycles. From t7-t8, t12-t13 and t17-t18, Vread-B, high PE is applied for high PE cycles, and Vread-B, low PE is applied for low PE cycles. From t8-t9, t13-t14 and t18-t19, Vread-C, high PE is applied high PE cycles, and Vread-C, low PE is applied for low PE cycles.

Figure 18:
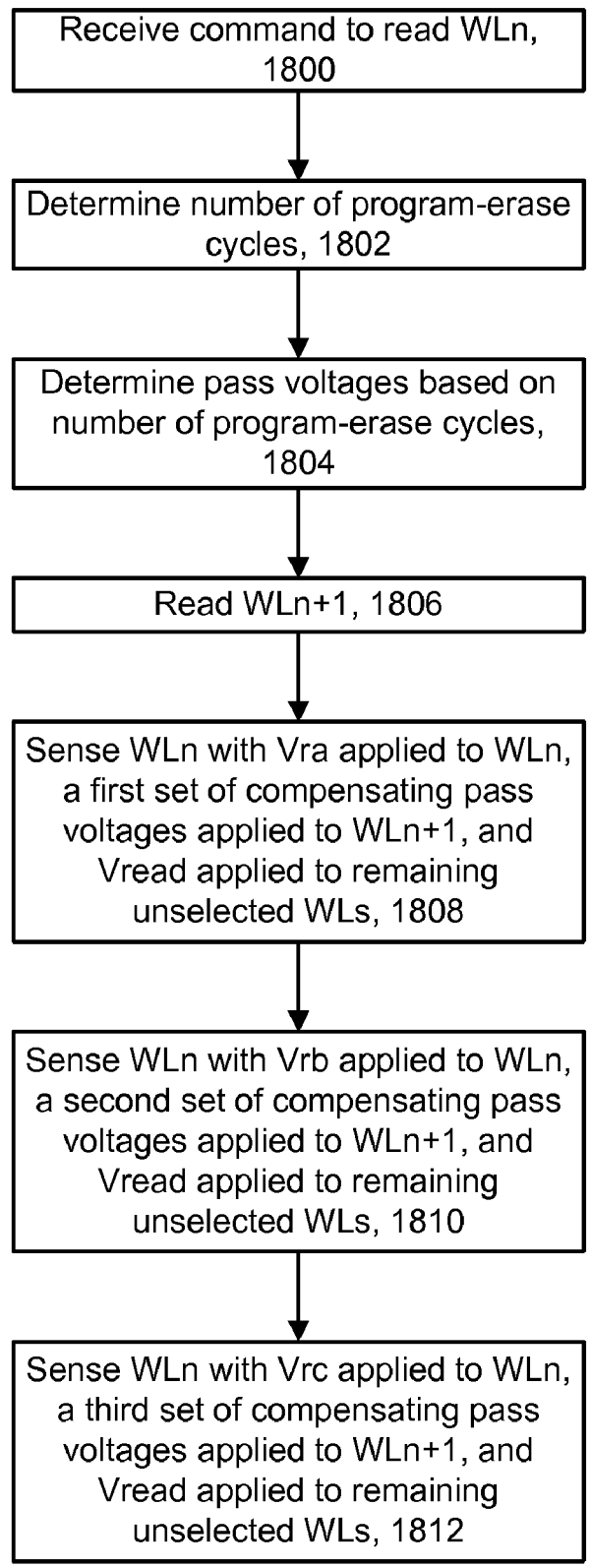
FIG. 18 depicts an overview of a read process.

FIG. 18 depicts an overview of a read process. At step 1800, a read command to read WLn is received. The read command may be received by a controller from an external host, for instance. In response to the read command, step 1802 includes determining a number of program-erase cycles which have been experienced by the block of storage elements which is being read. Step 1804 includes determining pass voltages based on the number of program-erase cycles, such as by accessing data as set forth in FIG. 15*c*. Steps 1802 and 1804 are optional. At step 1806, WLn+1 is read. Note that this is a rough read process which is not fully compensated for coupling as is the read of WLn.

Step 1808 includes sensing WLn with Vra applied to WLn, a first set of compensating pass voltages applied to WLn+1, and Vread applied to the remaining unselected word lines. Step 1810 includes sensing WLn with Vrb applied to WLn, a second set of compensating pass voltages applied to WLn+1, and Vread applied to the remaining unselected word lines.

Step 1812 includes sensing WLn with Vrb applied to WLn, a third set of compensating pass voltages applied to WLn+1, and Vread applied to the remaining unselected word lines. Once the read operation is completed, storage elements in another word line or block may be read.

Figure 19:
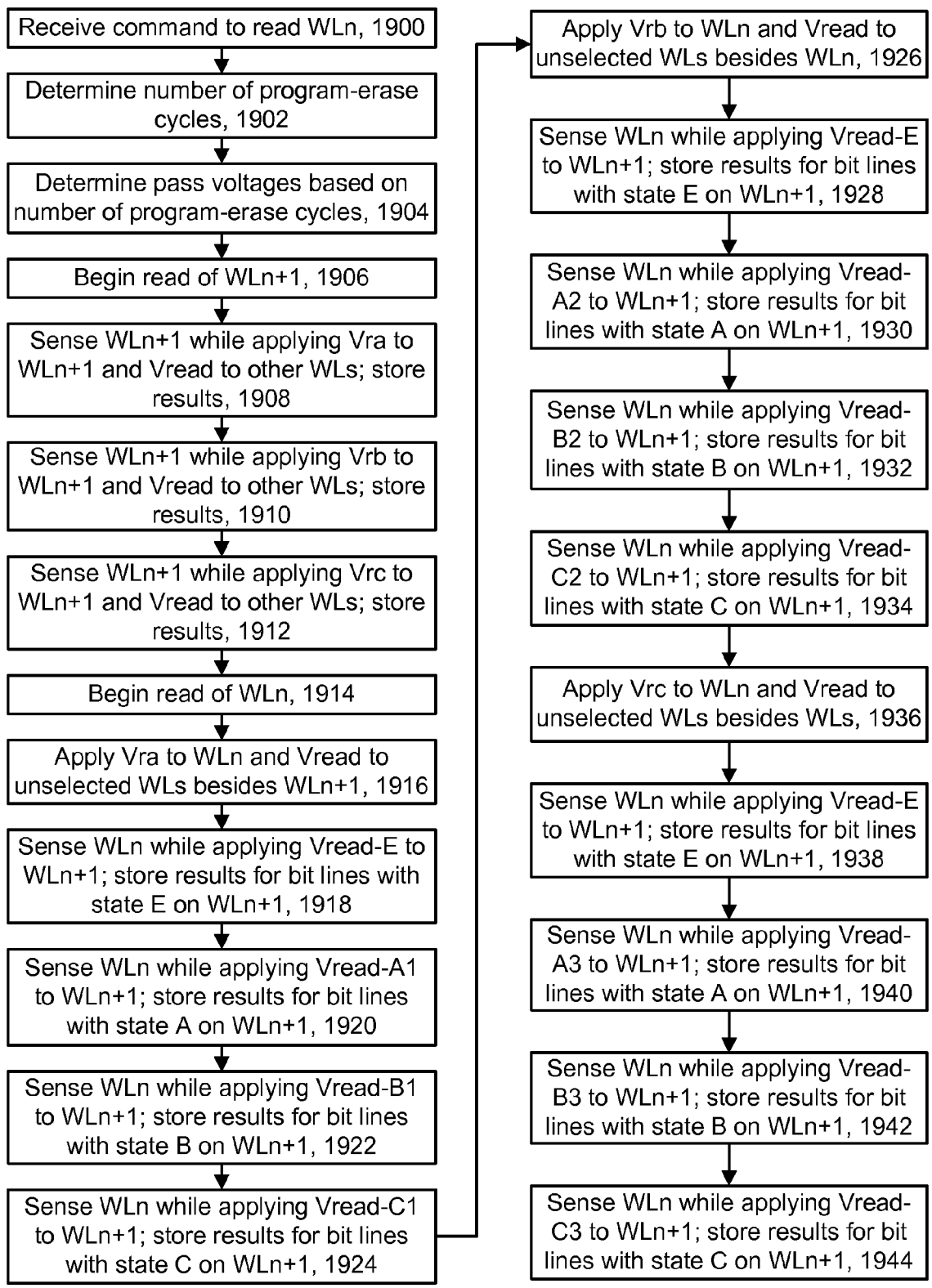
FIG. 19 depicts details of a read process.

FIG. 19 depicts details of a read process. This example involves four data states. Other implementations, such as with additional data states, are also possible. At step 1900, a read command is received to read WLn. At step 1902, a number of program-erase cycles is determined. At step 1904, pass voltages are determined based on the number of program-erase cycles. A read process for WLn+1 begins at step 1906, and involves steps 1908-1912. At step 1908, WLn+1 is sensed while applying Vra to WLn+1 and Vread to other word lines, and the result of the sensing is stored. The result indicates whether the read storage elements on WLn+1 are conductive or non-conductive. At step 1910, WLn+1 is sensed while applying Vrb to WLn+1 and Vread to other word lines, and the result of the sensing is stored. At step 1912, WLn+1 is sensed while applying Vrc to WLn+1 and Vread to other word lines, and the result of the sensing is stored. At this point, the data state of each storage element on WLn+1 is known. Note that steps 1908-1912 can be performed once for all storage elements on WLn+1, in an all bit line read process. Or, steps 1908-1912 can be performed a first time for a first subset of storage elements on WLn+1, such as those connected to even numbered bit lines, and a second time for a second subset of storage elements on WLn+1, such as those connected to odd numbered bit lines, in an all even-odd read process.

A read process for WLn begins at step 1914, and involves steps 1916-1944, which can be performed once for all storage elements on WLn, in an all bit line read process, or the steps can be performed a first time for a first subset of storage elements on WLn, such as those connected to even numbered bit lines, and a second time for a second subset of storage elements on WLn, such as those connected to odd numbered bit lines, in an all even-odd read process.

At step 1916, Vra is applied to WLn and Vread is applied to unselected word lines other than WLn+1, during which steps 1918-1924 are performed. At step 1918, WLn is sensed while applying Vread-E to WLn+1, and the result is stored for bit lines with the corresponding state, the E state, on WLn+1. Results are not stored for bit lines with other states on WLn+1. For example, if storage element 1124 in WLn+1 in FIG. 11 is at state E, the result of sensing of storage element 1114 on WLn at step 1918 will be stored in step 1918. If storage element 1124 is at any other state, such as state A, B or C, the result of sensing of storage element 1114 on WLn at step 1918 will not be stored in step 1918. Essentially, the sensing result for a particular storage element on WLn is stored when the read pass voltage on WLn+1 corresponds to the state of the storage element on WLn+1 which is adjacent to the particular storage element, on the same bit line, and on the drain side of the particular storage element and its associated selected word line. The results indicate whether the read storage elements on WLn are conductive or non-conductive.

At step 1920, WLn is sensed while applying Vread-A1 to WLn+1, and the result is stored for bit lines with the corresponding state, the A state, on WLn+1. At step 1922, WLn is sensed while applying Vread-B1 to WLn+1, and the result is stored for bit lines with the corresponding state, the B state, on WLn+1. At step 1924, WLn is sensed while applying Vread-C1 to WLn+1, and the result is stored for bit lines with the corresponding state, the C state, on WLn+1.

At step 1926, Vrb is applied to WLn and Vread is applied to unselected word lines other than WLn+1, during which steps 1928-1934 are performed. At step 1928, WLn is sensed while applying Vread-E to WLn+1, and the result is stored for bit lines with the corresponding state, the E state, on WLn+1. At step 1930, WLn is sensed while applying Vread-A2 to WLn+1, and the result is stored for bit lines with the corresponding state, the A state, on WLn+1. At step 1932, WLn is sensed while applying Vread-B2 to WLn+1, and the result is stored for bit lines with the corresponding state, the B state, on WLn+1. At step 1934, WLn is sensed while applying Vread-C2 to WLn+1, and the result is stored for bit lines with the corresponding state, the C state, on WLn+1.

At step 1936, Vrc is applied to WLn and Vread is applied to unselected word lines other than WLn+1, during which steps 1938-1944 are performed. At step 1938, WLn is sensed while applying Vread-E to WLn+1, and the result is stored for bit lines with the corresponding state, the E state, on WLn+1. At step 1940, WLn is sensed while applying Vread-A3 to WLn+1, and the result is stored for bit lines with the corresponding state, the A state, on WLn+1. At step 1942, WLn is sensed while applying Vread-B3 to WLn+1, and the result is stored for bit lines with the corresponding state, the B state, on WLn+1. At step 1944, WLn is sensed while applying Vread-C3 to WLn+1, and the result is stored for bit lines with the corresponding state, the C state, on WLn+1.

Note that the pass voltages are optionally adjusted base on the number of program-erase cycles. It is also possible to use the same set of pass voltages for each control gate read voltage on WLn. For example, a common pass voltage Vread-A can be used in steps 1920, 1930 and 1940, a common pass voltage Vread-B can be used in steps 1922, 1932 and 1942, and a common pass voltage Vread-C can be used in steps 1924, 1934 and 1944.

As can be seen, provided herein, in one embodiment, is a method for operating a non-volatile storage system includes: (a) tracking a number of program-erase cycles experienced by a set of storage elements in the non-volatile storage system. The method further includes: (b) receiving a request to read a state of at least one selected storage element in the set of storage elements, where the set of storage elements is in communication with a set of word lines, and the at least one selected storage element is in communication with a selected word line WLn of the set of word lines. The method further includes, in response to the read request: (c) reading a state of at least one unselected storage element in the set of storage elements, where the at least one unselected storage element is in communication with WLn+1, which is an adjacent, drain-side word line of WLn, (d) applying different state-demarcating voltages to WLn, and applying a different set of read pass voltages to WLn+1 for each state-demarcating voltage applied to WLn, where a corresponding read pass voltage in each set of read pass voltages is associated with the state of the at least one unselected storage element, and a level of the corresponding read pass voltage is a function of the number of program-erase cycles, and (e) determining the state of the at least one selected storage element by sensing whether the at least one selected storage element is conductive when the corresponding read pass voltage is applied to WLn+1, and when one or more of the state-demarcating voltages are applied to WLn.

In another embodiment, a non-volatile storage system includes a set of storage elements, a set of word lines in communication with the set of storage elements, and one or more control circuits in communication with the set of word lines. The one or more control circuits: (a) track a number of program-erase cycles experienced by the set of storage elements, and (b) receive a request to read a state of at least one selected storage element in the set of storage elements, where the at least one selected storage element is in communication with a selected word line WLn of the set of word lines. The one or more control circuits, in response to the read request: (c) read a state of at least one unselected storage element in the set of storage elements, where the at least one unselected storage element is in communication with WLn+1, which is an adjacent, drain-side word line of WLn, (d) apply different state-demarcating voltages to WLn, and applying a different set of read pass voltages to WLn+1 for each state-demarcating voltage applied to WLn, where a corresponding read pass voltage in each set of read pass voltages is associated with the state of the at least one unselected storage element, and a level of the corresponding read pass voltage is a function of the number of program-erase cycles, and (e) determine the state of the at least one selected storage element by sensing whether the at least one selected storage element is conductive when the corresponding read pass voltage is applied to WLn+1, and when one or more of the state-demarcating voltages are applied to WLn.

In another embodiment, a non-volatile storage system includes a set of storage elements, a set of word lines in communication with the set of storage elements, and one or more control circuits in communication with the set of word lines. The set of storage elements includes at least one selected storage element which is in communication with a selected word line WLn of the set of word lines, and at least one unselected storage element which is in communication with WLn+1, an adjacent, drain-side word line of WLn. The one or more control circuits: (a) track a number of program-erase cycles experienced by the set of storage elements, (b) receive a request to read a state of the at least one selected storage element, and (c) in response to the read request: (i) read a state of the at least one unselected storage element, (ii) apply different state-demarcating voltages to WLn, (iii) apply a different set of read pass voltages to WLn+1 for each state-demarcating voltage applied to WLn, where a corresponding read pass voltage in each set of read pass voltages is associated with the state of the at least one unselected storage element, and a level of the corresponding read pass voltage is a function of the number of program-erase cycles, and (iv) determine the state of the at least one selected storage element by sensing whether the at least one selected storage element is conductive when the corresponding read pass voltage is applied to WLn+1, and when one or more of the state-demarcating voltages are applied to WLn.

A corresponding method for performing the above-mentioned steps of the one or more control circuits may also be provided.

In another embodiment, a method for operating a non-volatile storage system includes: (a) receiving a request to read a state of at least one selected storage element in a set of storage elements, where the set of storage elements is in communication with a set of word lines, and the at least one selected storage element is in communication with a selected word line WLn of the set of word lines. In response to the read request, the method further includes: (b) reading a state of at least one unselected storage element in the set of storage elements, where the at least one unselected storage element is in communication with WLn+1, which is an adjacent, drain-side word line of WLn, (c) applying different state-demarcating voltages to WLn, and applying a different set of read pass voltages to WLn+1 for each state-demarcating voltage applied to WLn, where a corresponding read pass voltage in each set of read pass voltages is associated with the state of the at least one unselected storage element, and the corresponding read pass voltage differs in at least two of the sets of read pass voltages, and (d) determining the state of the at least one selected storage element by sensing whether the at least one selected storage element is conductive when the corresponding read pass voltage is applied to WLn+1, and when one or more of the state-demarcating voltages are applied to WLn.

A corresponding non-volatile storage system which performs the above-mentioned method may also be provided.

Corresponding methods, systems and computer- or processor-readable storage devices for performing the methods provided herein may also be provided.

The foregoing detailed description has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:
   tracking a number of program-erase cycles experienced by a set of storage elements in the non-volatile storage system;
   receiving a request to read a state of at least one selected storage element in the set of storage elements, the set of storage elements is in communication with a set of word lines, and the at least one selected storage element is in communication with a selected word line WLn of the set of word lines; and
   in response to the read request:
      reading a state of at least one unselected storage element in the set of storage elements, the at least one unselected storage element is in communication with WLn+1, an adjacent, drain-side word line of WLn;
      applying different state-demarcating voltages to WLn, and applying a different set of read pass voltages to WLn+1 for each state-demarcating voltage applied to WLn, a corresponding read pass voltage in each set of read pass voltages is associated with the state of the at least one unselected storage element, and a level of the corresponding read pass voltage is a function of the number of program-erase cycles; and
      determining the state of the at least one selected storage element by sensing whether the at least one selected storage element is conductive when the corresponding read pass voltage is applied to WLn+1, and when one or more of the state-demarcating voltages are applied to WLn.

2. The method of claim 1, wherein:
   the level of the corresponding read pass voltage increases with the number of program-erase cycles.

3. The method of claim 1, wherein:
   the level of the corresponding read pass voltage increases with the number of program-erase cycles at a higher rate initially when the number of program-erase cycles is within a first range of program-erase cycles, and at a lower rate subsequently when the number of program-erase cycles is within a second range of program-erase cycles.

4. The method of claim 1, wherein:
   levels of at least two of the read pass voltages in each set of read pass voltages are a function of the number of program-erase cycles.

5. The method of claim 1, wherein:
the level of the corresponding read pass voltage is a function of the state-demarcating voltages.

6. A non-volatile storage system, comprising:
a set of storage elements;
a set of word lines in communication with the set of storage elements;
the set of storage elements includes at least one selected storage element which is in communication with a selected word line WLn of the set of word lines, and at least one unselected storage element which is in communication with WLn+1, an adjacent, drain-side word line of WLn; and
one or more control circuits in communication with the set of word lines, the one or more control circuits: (a) track a number of program-erase cycles experienced by the set of storage elements, (b) receive a request to read a state of the at least one selected storage element, and (c) in response to the read request: (i) read a state of the at least one unselected storage element, (ii) apply different state-demarcating voltages to WLn, (e) apply a different set of read pass voltages to WLn+1 for each state-demarcating voltage applied to WLn, a corresponding read pass voltage in each set of read pass voltages is associated with the state of the at least one unselected storage element, and a level of the corresponding read pass voltage is a function of the number of program-erase cycles, and (iii) determine the state of the at least one selected storage element by sensing whether the at least one selected storage element is conductive when the corresponding read pass voltage is applied to WLn+1, and when one or more of the state-demarcating voltages are applied to WLn.

7. The non-volatile storage system of claim 6, wherein:
the level of the corresponding read pass voltage increases with the number of program-erase cycles.

8. The non-volatile storage system of claim 6, wherein:
the level of the corresponding read pass voltage increases with the number of program-erase cycles at a higher rate initially when the number of program-erase cycles is within a first range of program-erase cycles, and at a lower rate subsequently when the number of program-erase cycles is within a second range of program-erase cycles.

9. The non-volatile storage system of claim 6, wherein:
the corresponding read pass voltage differs in each set of read pass voltages.

10. The non-volatile storage system of claim 6, wherein:
the level of the corresponding read pass voltage is a function of the state-demarcating voltages.

11. The non-volatile storage system of claim 6, wherein:
the storage elements in the set of storage elements are arranged in NAND strings; and
the at least one unselected storage element is in a common NAND string with the at least one selected storage element.

12. A method for operating a non-volatile storage system, comprising:
receiving a request to read a state of at least one selected storage element in a set of storage elements, the set of storage elements is in communication with a set of word lines, and the at least one selected storage element is in communication with a selected word line WLn of the set of word lines; and
in response to the read request:
reading a state of at least one unselected storage element in the set of storage elements, the at least one unselected storage element is in communication with WLn+1, which is an adjacent, drain-side word line of WLn;
applying different state-demarcating voltages to WLn, and applying a different set of read pass voltages to WLn+1 for each state-demarcating voltage applied to WLn, a corresponding read pass voltage in each set of read pass voltages is associated with the state of the at least one unselected storage element, and the corresponding read pass voltage differs in at least two of the sets of read pass voltages; and
determining the state of the at least one selected storage element by sensing whether the at least one selected storage element is conductive when the corresponding read pass voltage is applied to WLn+1, and when one or more of the state-demarcating voltages are applied to WLn.

13. The method of claim 12, wherein:
the corresponding read pass voltage differs in each set of read pass voltages.

14. The method of claim 12, wherein:
a level of the corresponding read pass voltage is a function of the state-demarcating voltages.

15. The method of claim 12, wherein:
the corresponding read pass voltage varies in magnitude inversely with the state-demarcating voltages such that the corresponding read pass voltage is higher when the state-demarcating voltage is lower, and the corresponding read pass voltage is lower when the state-demarcating voltage is higher.

16. The method of claim 12, wherein:
the state of the at least one selected storage element is one of $2^N$ possible states; and
each different set of read pass voltages comprises $2^N$ different voltages.

17. The method of claim 12, wherein:
the at least one unselected storage element is programmed at least in part after the at least one selected storage element is programmed, so that the at least one selected storage element experiences electromagnetic coupling from the at least one unselected storage element, and the different sets of read pass voltages provide compensation for the electromagnetic coupling, the compensation is a function of the state of the at least one unselected storage element and the state of the at least one selected storage element.

18. The method of claim 12, further comprising:
tracking a number of program-erase cycles experienced by the set of storage elements, a level of the corresponding read pass voltage is a function of the number of program-erase cycles.

19. The method of claim 12, wherein:
each different set of read pass voltages comprises a lowest read pass voltage which is the same in each different set of read pass voltages, and a first next higher read pass voltage which differs in each different set of read pass voltages.

20. The method of claim 19, wherein:
each different set of read pass voltages comprises a second next higher read pass voltage which differs in each different set of read pass voltages.

* * * * *